(12) United States Patent
Fudeta et al.

(10) Patent No.: US 7,538,360 B2
(45) Date of Patent: May 26, 2009

(54) NITRIDE-BASED SEMICONDUCTOR LIGHT-EMITTING DEVICE AND MANUFACTURING METHOD THEREOF

(75) Inventors: Mayuko Fudeta, Mihara (JP); Toshio Hata, Mihara (JP)

(73) Assignee: Sharp Kabushiki Kaisha, Osaka (JP)

( * ) Notice: Subject to any disclaimer, the term of this patent is extended or adjusted under 35 U.S.C. 154(b) by 156 days.

(21) Appl. No.: 10/413,856

(22) Filed: Apr. 14, 2003

(65) Prior Publication Data

US 2004/0031967 A1 Feb. 19, 2004

(30) Foreign Application Priority Data

Apr. 17, 2002 (JP) ............... 2002-115060

(51) Int. Cl.
*H01L 27/15* (2006.01)
(52) U.S. Cl. .................. 257/99; 257/98; 257/E33.066
(58) Field of Classification Search ............... 257/79, 257/89, 90, 91, 81, 82, 83, 84, 80, 94, 96, 257/99, 100, 101, 102, 103, 98; 438/22, 438/37
See application file for complete search history.

(56) References Cited

U.S. PATENT DOCUMENTS

| | | | | |
|---|---|---|---|---|
| 5,078,803 A | * | 1/1992 | Pier et al. | 136/256 |
| 5,814,837 A | * | 9/1998 | Okazaki | 257/91 |
| 5,825,052 A | * | 10/1998 | Shakuda | 257/94 |
| 5,889,295 A | * | 3/1999 | Rennie et al. | 257/96 |
| 6,033,540 A | * | 3/2000 | Kosaki et al. | 204/284 |
| 6,078,064 A | | 6/2000 | Ming-Jiunn et al. | |
| 6,184,544 B1 | * | 2/2001 | Toda et al. | 257/98 |
| 6,396,082 B1 | * | 5/2002 | Fukasawa et al. | 257/79 |
| 6,496,162 B2 | * | 12/2002 | Kawakami et al. | 345/46 |
| 6,603,146 B1 | | 8/2003 | Hata et al. | |
| 2001/0015469 A1 | * | 8/2001 | Birkhahn et al. | 257/442 |
| 2002/0030194 A1 | * | 3/2002 | Camras et al. | 257/98 |
| 2002/0030196 A1 | * | 3/2002 | Iwata et al. | 257/102 |
| 2002/0088985 A1 | * | 7/2002 | Komoto et al. | 257/99 |
| 2004/0087050 A1 | * | 5/2004 | Uemura et al. | 438/46 |

FOREIGN PATENT DOCUMENTS

JP 10-270761 10/1998

(Continued)

OTHER PUBLICATIONS

Lin et al. "nitride-Based Light Emitting Diodes With Ni/ITO p-t-ype ohmic contacts." IEEE Photonics vol. 12 1668-1670 2002.*

(Continued)

*Primary Examiner*—Jack Chen
*Assistant Examiner*—Matthew Reames
(74) *Attorney, Agent, or Firm*—Morrison & Foerster LLP

(57) ABSTRACT

A nitride-based semiconductor light-emitting device and a manufacturing method thereof are provided. The nitride-based light-emitting device includes a first conductivity type nitride-based semiconductor layer, a light-emitting layer and a second conductivity type nitride-based semiconductor layer, that are successively layered above a translucent base. A first conductivity type electrode layer is electrically connected to the first conductivity type nitride-based semiconductor layer, and a second conductivity type electrode layer is electrically connected to the second conductivity type nitride-based semiconductor layer.

18 Claims, 23 Drawing Sheets

FOREIGN PATENT DOCUMENTS

| | | |
|---|---|---|
| JP | 10-321905 A | 12/1998 |
| JP | 11-168236 A | 6/1999 |
| JP | 2001-111109 A | 4/2001 |
| JP | 2001-122693 A | 5/2001 |
| JP | 2001-313422 A | 11/2001 |
| JP | 2001-339100 A | 12/2001 |
| JP | 2002-027831 A | 1/2002 |

OTHER PUBLICATIONS

Horng, R.H. et al. (Nov. 15, 1999). "AlGaInP Light-Emitting Diodes with Mirror Substrates Fabricated by Wafer Bonding," *Applied Physics Letters* 75(20):3054-3056.

\* cited by examiner

NITRIDE-BASED SEMICONDUCTOR LIGHT-EMITTING DEVICE AND MANUFACTURING METHOD THEREOF

BACKGROUND OF THE INVENTION

1. Field of the Invention

The present invention relates to a nitride-based semiconductor light-emitting device using a nitride-based semiconductor ($In_xAl_yGa_{1-x-y}N$: $0 \leq x$, $0 \leq y$ and $x+y<1$), as well as a manufacturing method thereof.

2. Description of the Background Art

Japanese Patent Laying-Open No. 10-270761 discloses a structure of a conventional nitride-based semiconductor light-emitting device, which is shown in FIG. 23. In FIG. 23, the conventional nitride-based semiconductor light-emitting device has a structure in which a p-type ohmic contact layer 101, a p-type GaN layer 102, an active layer 103, an n-type GaN layer 104, and an n-side electrode 105 are successively layered on an Al substrate 100.

The conventional nitride-based semiconductor light-emitting device is fabricated in the following manner. Initially, n-type GaN layer 104, active layer 103, and p-type GaN layer 102 are successively layered on a sapphire substrate (not shown), to form a semiconductor layered portion. Thereafter, p-type ohmic contact layer 101, which is an alloyed layer of Ni and Au and readily forms ohmic contact with p-type GaN layer 102, is provided on the entire upper surface of p-type GaN layer 102. Then, Al substrate 100 is attached as a support base on the upper surface of p-type ohmic contact layer 101, with a conductive adhesive such as an Ag paste. The sapphire substrate is then completely removed by polishing. Finally, n-side electrode 105 fabricated from an alloyed layer of Ti and Au, for example, is patterned and formed on the surface of n-type GaN layer 104 exposed by removing the sapphire substrate.

In the conventional nitride-based semiconductor light-emitting device as described above, light emitted from active layer 103 to Al substrate 100 side is reflected at an interface S between p-type GaN layer 102 and p-type ohmic contact layer 101, and extracted to the outside of the device. On the other hand, because Al substrate 100 serving as the support base is not transparent, light extraction efficiency thereof is significantly affected by reflectivity at interface S between p-type GaN layer 102 and p-type ohmic contact layer 101. P-type ohmic contact layer 101, however, is formed with the alloyed layer of Ni and Au. Accordingly, reflectivity at the interface with p-type GaN layer 102 is low, and most part of the light is absorbed.

In addition, though the sapphire substrate is completely removed by polishing, there is inplane variation of several μm in a film thickness of the polished sapphire, even if a high-precision polishing technique is used. Therefore, n-type GaN layer 104 should be formed with a film thickness not smaller than several μm, that is, with a sufficient margin, so as not to have a portion of n-type GaN layer 104 removed by polishing. For such reasons, yield is poor, and manufacturing cost tends to increase.

SUMMARY OF THE INVENTION

In view of the above-mentioned situations, an object of the present invention is to provide a nitride-based semiconductor light-emitting device capable of improving extraction efficiency of light emitted from an light-emitting layer, as well as a manufacturing method thereof.

In order to achieve the object as above, a nitride-based semiconductor light-emitting device according to the present invention includes a first conductivity type nitride-based semiconductor layer, a light-emitting layer, and a second conductivity type nitride-based semiconductor layer, that are successively layered above a translucent base. A first conductivity type electrode layer is electrically connected to the first conductivity type nitride-based semiconductor layer, and a second conductivity type electrode layer is electrically connected to the second conductivity type nitride-based semiconductor layer.

Here, in the nitride-based semiconductor light-emitting device according to the present invention, preferably, the translucent base is composed of a translucent resin or SOG (Spin on Glass). Here, SOG refers to a silicon dioxide film provided by applying silicon dioxide dissolved in an inorganic solvent or an organic solvent on a wafer by spinning.

In the nitride-based semiconductor light-emitting device according to the present invention, preferably, the translucent base includes a wavelength-changing material.

In the nitride-based semiconductor light-emitting device according to the present invention, preferably, the first conductivity type nitride-based semiconductor layer is a p-type nitride-based semiconductor layer, and the second conductivity type nitride-based semiconductor layer is an n-type nitride-based semiconductor layer.

In the nitride-based semiconductor light-emitting device according to the present invention, preferably, at least a portion of the first conductivity type electrode layer is formed between the translucent base and the first conductivity type nitride-based semiconductor layer.

Here, preferably, the first conductivity type electrode layer formed between the translucent base and the first conductivity type nitride-based semiconductor layer is formed so as to be in contact with almost entire surface of the first conductivity type nitride-based semiconductor layer.

In addition, preferably, at least a portion of the first conductivity type electrode layer formed between the translucent base and the first conductivity type nitride-based semiconductor layer is formed in a meshed manner.

In the nitride-based semiconductor light-emitting device according to the present invention, preferably, the first conductivity type electrode layer includes a conductor forming ohmic contact with the first conductivity type nitride-based semiconductor layer.

In the nitride-based semiconductor light-emitting device according to the present invention, preferably, the first conductivity type electrode layer includes a metal thin-film layer and/or a transparent conductive layer.

Here, preferably, the metal thin-film layer includes at least one metal selected from a group consisting of palladium (Pd), nickel (Ni), platinum (Pt), rhodium (Rh), ruthenium (Ru), osmium (Os), iridium (Ir), hafnium (Hf), titanium (Ti), aluminium (Al), scandium (Sc), zirconium (Zr), and vanadium (V).

In addition, preferably, the transparent conductive layer includes an oxide of at least one element selected from a group consisting of zinc (Zn), indium (In), tin (Sn), magnesium (Mg), cadmium (Cd), gallium (Ga), and lead (Pb).

Further, according to the present invention, a method of manufacturing a nitride-based semiconductor light-emitting device includes the steps of: preparing a substrate, and successively layering a second conductivity type nitride-based semiconductor layer, a light-emitting layer and a first conductivity type nitride-based semiconductor layer on the substrate; forming a first conductivity type electrode layer on the first conductivity type nitride-based semiconductor layer;

forming a second conductivity type electrode layer on the second conductivity type nitride-based semiconductor layer; and forming a translucent base on the first conductivity type electrode layer.

Here, preferably, the method of manufacturing a nitride-based semiconductor light-emitting device according to the present invention further includes the step of removing at least a portion of the substrate.

Preferably, in the method of manufacturing a nitride-based semiconductor light-emitting device according to the present invention, the substrate is an Si substrate.

Preferably, in the method of manufacturing a nitride-based semiconductor light-emitting device according to the present invention, the Si substrate is removed by an etchant including a mixture containing hydrofluoric acid and nitric acid, and the second conductivity type nitride-based semiconductor layer formed on the Si substrate serves as an etch stop layer.

Preferably, the method of manufacturing a nitride-based semiconductor light-emitting device according to the present invention further includes the step of forming the first conductivity type electrode layer on the first conductivity type nitride-based semiconductor layer, followed by heat treatment of these layers at a temperature from 300 to 700° C.

Preferably, the method of manufacturing a nitride-based semiconductor light-emitting device according to the present invention further includes the step of forming a metal thin-film layer and/or a transparent conductive layer as the first conductivity type electrode layer.

Preferably, the method of manufacturing a nitride-based semiconductor light-emitting device according to the present invention further includes the step of forming at least a portion of the first conductivity type electrode layer in a meshed manner.

Preferably, the method of manufacturing a nitride-based semiconductor light-emitting device according to the present invention further includes the step of forming a pad electrode on the first conductivity type electrode layer.

Preferably, the method of manufacturing a nitride-based semiconductor light-emitting device according to the present invention further includes the step of forming a thick-film metal layer on the first conductivity type electrode layer.

Preferably, in the method of manufacturing a nitride-based semiconductor light-emitting device according to the present invention, the translucent base is formed by at least one method selected from a group consisting of a method of curing a translucent resin or SOG (Spin on Glass), a method of attaching a translucent resin film, and a method of attaching a translucent resin board.

Preferably, in the method of manufacturing a nitride-based semiconductor light-emitting device according to the present invention, the translucent resin is cured by at least one method selected from a group consisting of a method of mixing a curing agent in the translucent resin, a method of heating a thermosetting resin used as the translucent resin, and a method of irradiating an ultraviolet ray hardening resin used as the translucent resin with ultraviolet ray.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
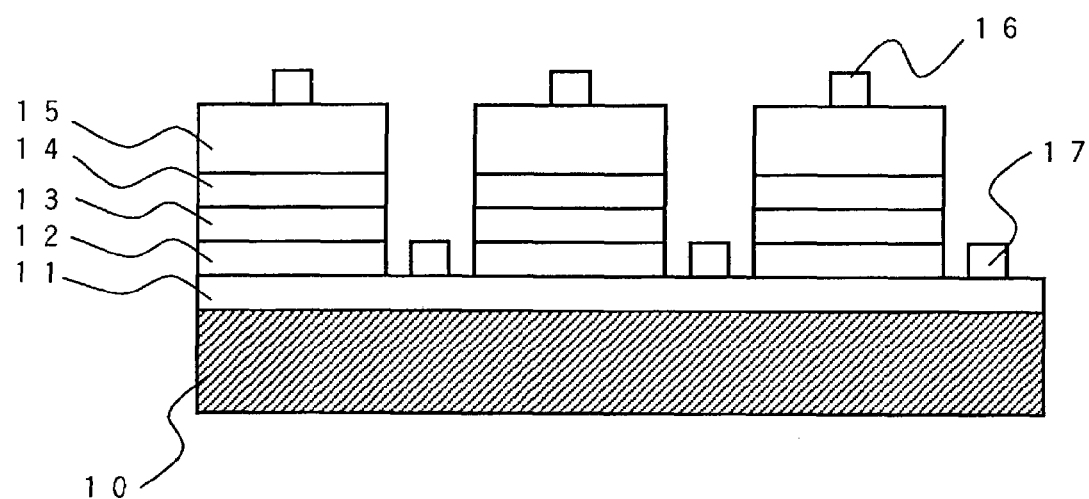
FIG. 1 is a schematic side view of a nitride-based semiconductor light-emitting device in a first embodiment.

In the following, embodiments of the present invention will be described.

(Translucent Base)

The nitride-based semiconductor light-emitting device according to the present invention is characterized by using the translucent base. When the nitride-based semiconductor light-emitting device according to the present invention using the translucent base is subjected to die-bonding to a lead frame or the like with the Ag paste or the like with good reflectivity, light emitted from the light-emitting layer to the side of translucent base enters the translucent base with little absorption, and is reflected by a bottom face of the translucent base. Accordingly, the light can be extracted from a side face of the translucent base, and extraction efficiency of the light emitted from the light-emitting layer can be improved. Here, translucency refers to not only a property that all or a part of light emitted from the light-emitting layer transmits, but also a property that light once absorbed is changed in wavelength and emitted again.

A material for the translucent base used in the present invention is not limited in particular, and a conventionally known translucent material can be employed. Among others, a translucent resin or SOG is preferably used. A method of forming the translucent resin or SOG is easy and inexpensive, and therefore, manufacturing cost of the nitride-based semiconductor light-emitting device according to the present invention can be reduced. In addition, as a wavelength-changing material such as a phosphor can readily be mixed in the translucent resin or SOG, light of a variety of colors can be emitted. That is, a white light emitting device can also be fabricated. Here, a material for the translucent resin is not limited in particular, and a conventionally known resin with a translucency property as above may be employed. Preferably, however, a thermosetting resin or an ultraviolet ray hardening resin is employed. In such a case, the translucent base can be fabricated more easily. For the thermosetting resin, for example, phenolic resin, urea resin, melamine resin, unsaturated polyester resin, vinyl ester resin, diallyl phthalate resin, epoxy resin, or the like can be used. In addition, for the ultraviolet ray hardening resin, a resin cured by irradiating a product obtained by adding a photosensitizer such as benzophenone, triphenyl sulfonium, hexafluorophosphine or the like to an oligomer or a monomer such as a mixture of acrylate, epoxy compound or unsaturated compound with thiol, with ultraviolet ray from a light source such as a mercury lamp or a metal halide lamp may be used.

In addition, the translucent base preferably includes a wavelength-changing material. In this case, the light emitted from the light-emitting layer to the translucent base is changed in wavelength by the wavelength-changing material contained in the translucent base. Thus, light of which color ranges in red, blue, green, or mixture thereof, or white can be extracted from the side face of the translucent base. Here, for the wavelength-changing material, for example, a phosphor emitting red light, a phosphor emitting orange light, a phosphor emitting green light, a phosphor emitting blue light, a phosphor emitting white light, or the like can be used. For the phosphor emitting red light, for example, ZnS:Cu, LiAlO$_2$: Fe$^{3+}$, Al$_2$O$_3$:Cr, Y$_2$O$_3$:Eu$^{3+}$, Y(P,V)O$_4$:Eu$^{3+}$, Y$_2$O$_3$:Eu phosphor, a mix of Y$_2$O$_3$:Eu phosphor and Y$_2$O$_3$S:Eu phosphor, or the like can be used. In addition, for the phosphor emitting orange light, for example, ZnS:(Cu, Mn), (Zn, Cd) S:Ag, ZnS:Mn, (Sr, Mg, Ba)$_3$(PO$_4$)$_2$, or the like can be used. Further, for the phosphor emitting green light, for example, ZnS: (Cu, Al), LaPO$_4$:(Ce$^{3+}$, Tb$^{3+}$), Sr(S, Se):(Sm, Ce), ZnSiO$_4$: Mn$^{2+}$, βZnS:Cu, ZnS:Cu, Fe(Co), ZnS:Pb, ZnS:Cu phosphor, mix of ZnS:(Cu, Al) phosphor and Y$_2$Al$_5$O$_{12}$:Tb phosphor, or the like can be used. For the phosphor emitting blue light, for example, CaS:Bi, (Sr, Ca)$_{10}$(PO$_4$)$_6$C$_{12}$:Eu$^{2+}$, SrS:(Sm, Ce), Sr$_2$P$_2$O$_7$:Eu$^{2+}$, βZnS:Ag, (Ba, Ca, Mg)$_{10}$ (PO$_4$)$_6$ C$_{12}$:Eu$^{2+}$, 3Sr$_3$(PO$_4$)$_2$.CaCl$_2$:Eu$^{2+}$ phosphor, or the like can be used. For the phosphor emitting white light, for example, ZnO:Zn, ZnS:As, ZnS:(Au, Ag, Al), Ca$_2$P$_2$O$_7$:Dy, Ca$_3$(PO$_4$)$_2$.CaF$_2$:Sb, 3Ca$_3$(PO$_4$)$_2$.Ca(F,Cl)$_2$:Sb$^{3+}$, 3Ca$_3$(PO$_4$)$_2$. Ca(F,Cl)$_2$:(Sb$^{3+}$, Mn$^{2+}$), MgWO$_4$, 3Ca$_3$ (PO$_4$)$_2$.Ca(F,Cl)$_2$:(Sb$^{3+}$, Mn$^{2+}$) phosphor, or the like can be used. Here, notation of the phosphors as above is to be interpreted in accordance with a common notation method of phosphor composition. Single phosphor may be used, or a combination of a plurality of phosphors may be used.

(First Conductivity Type Nitride-Based Semiconductor Layer)

The first conductivity type nitride-based semiconductor layer used in the present invention is layered above the translucent base. As a material for the first conductivity type nitride-based semiconductor layer, a product obtained by injecting a p-type or n-type dopant into the nitride-based semiconductor represented with a general formula In$_x$Al$_y$Ga$_{1-x-y}$N (0≦x, 0≦y and x+y<1) may be employed. Among others, preferably, the first conductivity type nitride-based semiconductor layer is a p-type nitride-based semiconductor layer having the p-type dopant injected. Here, a conventionally known material can be used as the p-type dopant, and for example, one or more of Mg (magnesium), Zn (zinc), Cd (cadmium), Be (beryllium), and the like may be used.

In the above general formula In$_x$Al$_y$Ga$_{1-x-y}$N (0≦x, 0≦y and x+y<1), x represents composition ratio of In, while y represents composition ratio of Al. In addition, the first conductivity type nitride-based semiconductor layer may be formed with a single layer, or may be formed with two or more layers in which layers of different materials are in contact with each other. Further, the first conductivity type nitride-based semiconductor layer may or may not be in contact with the translucent base.

(Light-Emitting Layer)

The light-emitting layer used in the present invention is layered on the first conductivity type nitride-based semiconductor layer. For the material of the light-emitting layer, for example, the nitride-based semiconductor represented with the above general formula In$_x$Al$_y$Ga$_{1-x-y}$N (0≦x, 0≦y and x+y<1) may be used. In addition, the light-emitting layer used in the present invention may be either of an MQW (multiple quantum well) light-emitting layer or an SQW (single quantum well) light-emitting layer. The light-emitting layer may be of an arbitrary, quaternary or ternary mixed crystal, such as AlGaInN, GaNAs, GaNP, or the like.

(Second Conductivity Type Nitride-Based Semiconductor Layer)

The second conductivity type nitride-based semiconductor layer used in the present invention is formed on the light-emitting layer. As the material for the second conductivity type nitride-based semiconductor layer, for example, a product obtained by injecting a p-type or n-type dopant into the nitride-based semiconductor represented with the general formula In$_x$Al$_y$Ga$_{1-x-y}$N (0≦x, 0≦y and x+y<1) may be employed. Among others, preferably, the second conductivity type nitride-based semiconductor layer is an n-type nitride-based semiconductor layer having the n-type dopant injected.

Here, a conventionally known material can be used as the n-type dopant, and for example, one or more of Si (silicon), O (oxygen), Cl (chlorine), S (sulfur), C (carbon), Ge (germanium), and the like may be used.

(First Conductivity Type Electrode Layer)

The first conductivity type electrode layer used in the present invention is electrically connected to the first conductivity type nitride-based semiconductor layer. Here, preferably, at least a portion of the first conductivity type electrode layer is formed between the translucent base and the first conductivity type nitride-based semiconductor layer. In addition, more preferably, the first conductivity type electrode layer formed between the translucent base and the first conductivity type nitride-based semiconductor layer is formed so as to be in contact with almost entire surface of the first conductivity type nitride-based semiconductor layer. In such a case, current can be diffused more efficiently in the plane of the first conductivity type electrode layer, and the current can be fed into the light-emitting layer more uniformly.

Further, when at least a portion of the first conductivity type electrode layer is formed between the translucent base and the first conductivity type nitride-based semiconductor layer, preferably, at least a portion of the first conductivity type electrode layer formed therebetween is formed in a meshed manner. In this case, transmittance of the light emitted from the light-emitting layer can further be improved.

Though the material for the first conductivity type electrode layer is not limited in particular, the material preferably includes a conductor forming ohmic contact with the first conductivity type nitride-based semiconductor layer. In this case, a driving voltage of the nitride-based semiconductor light-emitting device of the present invention can further be reduced.

In addition, preferably, the first conductivity type electrode layer includes a metal thin-film layer and/or a transparent conductive layer. In this case, balance between the transmittance of the light emitted from the light-emitting layer and a good ohmic property can further be improved.

Here, more preferably, the metal thin-film layer contains at least one metal selected from a group consisting of Pd, Ni, Pt, Rh, Ru, Os, Ir, Hf, Ti, Al, Sc, Zr, and V. In this case, contact resistance between the first conductivity type electrode layer and the first conductivity type nitride-based semiconductor layer can be low, and the driving voltage of the nitride-based semiconductor light-emitting device of the present invention can be reduced.

Further, more preferably, the transparent conductive layer contains an oxide of at least one element selected from a group consisting of Zn, In, Sn, Mg, Cd, Ga, and Pb. Among others, the transparent conductive layer further preferably contains at least one oxide selected from a group consisting of ZnO (zinc oxide), $In_2O_3$ (indium oxide), $SnO_2$ (tin oxide), ITO (oxide of In and Sn), and MgO (magnesium oxide). In this case, since light in a wavelength range of violet to green among the light emitted from the light-emitting layer has high transmittance, the light extraction efficiency of the nitride-based semiconductor light-emitting device of the present invention can further be improved.

(Second Conductivity Type Electrode Layer)

The second conductivity type electrode layer used in the present invention is electrically connected to the second conductivity type nitride-based semiconductor layer. Though the material for the second conductivity type electrode layer is not limited in particular, the material more preferably contains at least one metal selected from a group consisting of Pd (palladium), Ni (nickel), Pt (platinum), Rh (rhodium), Ru (ruthenium), Os (osmium), Ir (iridium), Hf (hafnium), Ti (titanium), Al (aluminium), Sc (scandium), Zr (zirconium), and V (vanadium). In this case, contact resistance between the second conductivity type electrode layer and the second conductivity type nitride-based semiconductor layer can be low, and the driving voltage of the nitride-based semiconductor light-emitting device of the present invention can be reduced.

(Manufacturing Method)

In the following, a manufacturing method of a nitride-based semiconductor light-emitting device according to the present invention including the first conductivity type nitride-based semiconductor layer, the light-emitting layer and the second conductivity type nitride-based semiconductor layer that are successively layered above the translucent base will be described. First, a substrate is prepared, and on that substrate, the second conductivity type nitride-based semiconductor layer, the light-emitting layer and the first conductivity type nitride-based semiconductor layer are successively formed. Then, the first conductivity type electrode layer is formed on the first conductivity type nitride-based semiconductor layer, and the second conductivity type electrode layer is formed on the second conductivity type nitride-based semiconductor layer. Finally, the translucent base is formed on the first conductivity type electrode layer. By fabricating a nitride-based semiconductor light-emitting device with the manufacturing method including these process steps, a nitride-based semiconductor layer can be formed above the translucent base, even when the translucent base composed of a translucent resin or the like in which crystal growth of the nitride-based semiconductor layer is difficult is used. Here, the method of manufacturing the nitride-based semiconductor light-emitting device according to the present invention may include a process step other than those described above. In the method of manufacturing the nitride-based semiconductor light-emitting device according to the present invention, the order of process steps for forming the second conductivity type electrode layer and the translucent base described above may be switched.

Here, a conventionally known method can be used as a method of forming the nitride-based semiconductor layer. For example, LPE (liquid-phase epitaxy), VPE (vapor-phase epitaxy), MOCVD (metal-organic chemical vapor deposition), MBE (molecular beam epitaxy), gas source MBE, or a combination thereof may be used. Further, the substrate may be masked with an $SiO_2$ mask in a shape such as a tetragon, a circle, or other polygons, and the nitride-based semiconductor layer may selectively be formed. In addition, a buffer layer composed of AlN, n-type InAlN, p-type InAlN, or the like may be formed on the substrate, so as to form the nitride-based semiconductor layer. Particularly, when the buffer layer is an n-type or p-type nitride-based semiconductor layer, a process step of removing AlN by dry etching can be omitted, and manufacturing cost can further be reduced.

A conventionally known method can also be used as a method of forming the first conductivity type electrode layer on the first conductivity type nitride-based semiconductor layer. For example, vacuum deposition, sputtering, or a combination thereof may be employed.

Moreover, preferably, the method of manufacturing a nitride-based semiconductor light-emitting device according to the present invention includes the step of removing at least a portion of the substrate. In doing so, absorption of light at the substrate can further be reduced. Here, preferably, the substrate is an Si substrate. Unlike the sapphire substrate that has conventionally been used, the Si substrate can be removed by chemical etching or the like, that is, without polishing, and hence, removal of the substrate is easier. In addition, preferably, the Si substrate is removed by an etchant including a mixture containing hydrofluoric acid and nitric acid, and the second conductivity type nitride-based semiconductor layer formed on the Si substrate serves as an etch stop layer. In such a case, the Si substrate can selectively be etched, and the second conductivity type nitride-based semiconductor layer serves as the etch stop layer. Therefore, the substrate can be removed more easily.

Moreover, preferably, the method of manufacturing a nitride-based semiconductor light-emitting device according to the present invention further includes the step of forming the first conductivity type electrode layer on the first conductivity type nitride-based semiconductor layer, followed by heat treatment of these layers at a temperature from 300 to 700° C. The heat treatment is performed, more preferably, at a temperature from 400 to 600° C., and further more preferably, at a temperature from 450 to 550° C. In this case, in addition to obtaining good ohmic property, adhesion between the first conductivity type nitride-based semiconductor layer and the first conductivity type electrode layer is improved, and the nitride-based semiconductor layer is unlikely to come off from the translucent base. Therefore, manufacturing yield of the light-emitting device can further be improved. Moreover, even in an energization test lasting for a long time, the nitride-based semiconductor layer does not come off from the translucent base, and reliability of the light-emitting device can further be enhanced.

Preferably, the method of manufacturing a nitride-based semiconductor light-emitting device according to the present invention further includes the step of forming a metal thin-film layer and/or a transparent conductive layer as the first conductivity type electrode layer. Since the metal thin-film layer and the transparent conductive layer are easily formed, the first conductivity type electrode layer can more easily be formed in an arbitrary shape with a photolithography process or the like.

Preferably, the method of manufacturing a nitride-based semiconductor light-emitting device according to the present invention further includes the step of forming at least a portion of the first conductivity type electrode layer in a meshed manner. In this case, as the light transmittance at the first conductivity type electrode layer can further be improved, a light-emitting device having a higher light extraction efficiency can be fabricated.

Preferably, the method of manufacturing a nitride-based semiconductor light-emitting device according to the present invention further includes the step of forming a pad electrode on the first conductivity type electrode layer. In this case, the current can be fed more efficiently from the pad electrode.

Preferably, the method of manufacturing a nitride-based semiconductor light-emitting device according to the present invention further includes the step of forming a thick-film metal layer on the first conductivity type electrode layer. In this case, since the light-emitting device with electrode structures on the upper and lower sides thereof can easily be fabricated, and the light-emitting device with a more compact size can be fabricated. Here, as a process for forming the thick-film metal layer, a method in the following is used, for example. That is, a method of forming a thick-film plated layer by plating on the first conductivity type electrode layer exposed by removing a portion of the translucent base, or a method of forming the translucent base so as to embed a metal bump formed on the first conductivity type electrode layer. In addition, as the plating method as above, either of electroless plating or electroplating may be used. As a method of forming a metal bump, for example, a selective plating may be employed, that is, to plate solely a desired area with electro-plating or the like by using a resist for plating, such as a dry film resist, capable of attaining a thickness of approximately 100 μm.

Preferably, in the method of manufacturing a nitride-based semiconductor light-emitting device according to the present invention, the translucent base is formed by at least one method selected from a group consisting of a method of curing a translucent resin or SOG (Spin on Glass), a method of attaching a translucent resin film, and a method of attaching a translucent resin board. In such a case, the translucent base can be fabricated more easily, the manufacturing yield of the light-emitting device is improved, and manufacturing cost thereof can further be reduced. Here, the translucent resin film and the translucent resin board are both products molded from the translucent resin. The translucent resin film refers to a product of which thickness is not larger than 200 μm, while the translucent resin board refers to a product of which thickness is larger than 200 μm. The translucent resin film and the translucent resin board can be fabricated with a conventionally known method of molding the translucent resin, such as injection molding, extrusion, pressure forming, transfer molding, calendering, or the like.

Preferably, the translucent resin is cured by at least one method selected from a group consisting of a method of mixing a curing agent in the translucent resin, a method of heating a thermosetting resin used as the translucent resin, and a method of irradiating an ultraviolet ray hardening resin used as the translucent resin with ultraviolet ray. In this case as well, since the translucent base can be fabricated more easily, manufacturing yield of the light-emitting device is improved, and the manufacturing cost thereof can further be reduced.

As a method of curing the translucent resin by mixing the curing agent, for example, following methods may be employed. In one method, an amine-type curing agent such as triethylenetetramine, isophorone diamine, m-xylene diamine, polyamide amine, or diaminodiphenyl methane, an acid anhydride type curing agent such as methyltetrahydro phthalic anhydride, or a phenolic resin type curing agent such as phenolic novolac, is added to epoxy resin so as to extend chain thereof, to obtain a high molecular compound, and the chain is then heated so as to exhibit higher performance as the thermosetting resin, to achieve curing of the resin. Alternatively, in another method, an curing agent of an organic peroxide such as cumenhydro peroxide, di-tert-butyl peroxide, or the like is added to unsaturated polyester resin or vinyl ester resin so as to co-cure and fix chains to each other, to achieve curing of the resin.

In addition, as a method of heating the thermosetting resin described above, for example, a method of heating a thermosetting resin such as phenolic resin, urea resin, melamine resin, unsaturated polyester resin, vinyl ester resin, diallyl phthalate resin, epoxy resin, or the like can be used.

Moreover, as a method of irradiating the ultraviolet ray hardening resin with the ultraviolet ray, a method in which a resin is cured by irradiating a product obtained by adding a photosensitizer such as benzophenone, triphenyl sulfonium hexafluorophosphine or the like to an oligomer or a monomer such as a mixture of acrylate, epoxy compound or unsaturated compound with thiol, with ultraviolet ray from a light source such as a mercury lamp or a metal halide lamp may be used.

EXAMPLE

In the following, the present invention will be described in detail in conjunction with embodiments, however, the present invention is not limited thereto.

(First Embodiment)

FIG. 1 shows a schematic side view of one embodiment of the nitride-based semiconductor light-emitting device according to the present invention, using the translucent resin for the translucent base. In FIG. 1, in the nitride-based semiconductor light-emitting device according to the present invention, a p-type electrode layer 11 composed of Pd, a p-type contact layer 12 composed of p-type GaN, a p-type clad layer 13 composed of p-type AlGaN, a light-emitting layer 14 consisting of a barrier layer composed of GaN and a well layer composed of InGaN, an n-type clad layer 15 composed of Si doped GaN, and an n-type electrode layer 16 composed of Hf and Al are successively layered on a translucent base 10 composed of the translucent resin. On p-type electrode layer 11, a p-type pad electrode 17 composed of Pd and Au is formed.

Figure 2:
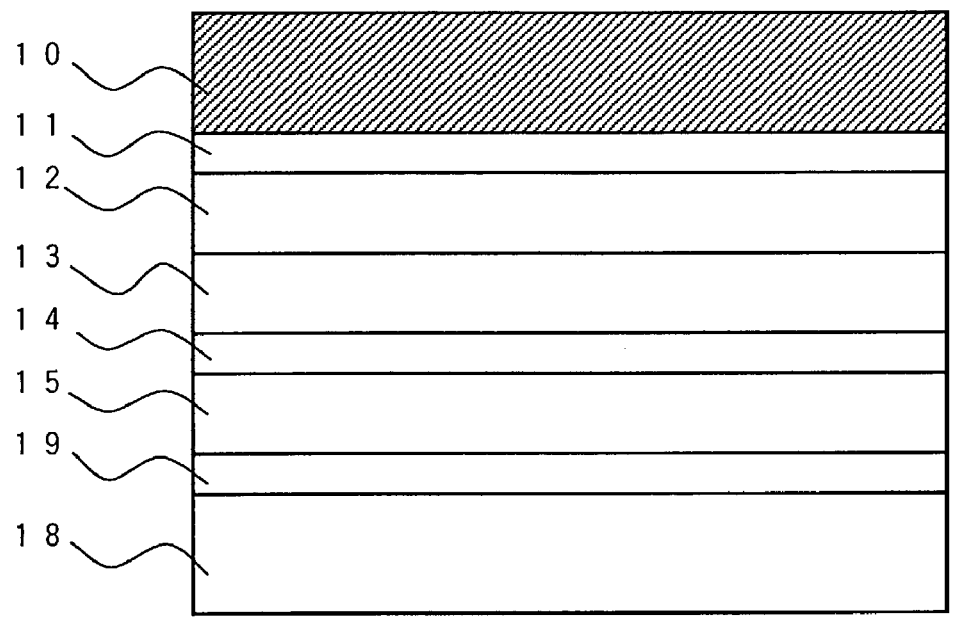
FIG. 2 is a schematic cross-sectional view of the nitride-based semiconductor light-emitting device during fabrication in the first embodiment, after a translucent base is formed.

In the following, a manufacturing method of the nitride-based semiconductor light-emitting device in the present embodiment will be described. Initially, as shown in FIG. 2, a buffer layer 19 composed of AlN, n-type clad layer 15, light-emitting layer 14, p-type clad layer 13, and p-type contact layer 12 are successively formed on an Si substrate 18. Then, Pd is evaporated to a thickness of 10 nm as p-type electrode layer 11 on the surface of p-type contact layer 12, followed by heat treatment for three minutes at 500° C. in vacuum. Thus, p-type electrode layer 11 is alloyed with p-type contact layer 12. By alloying, adhesion between p-type electrode layer 11 and p-type contact layer 12 is improved. Next, the ultraviolet ray hardening resin is applied as translucent base 10 onto p-type electrode layer 11, and irradiated with ultraviolet ray and cured. FIG. 2 shows a state of a wafer at this stage.

Figure 3:
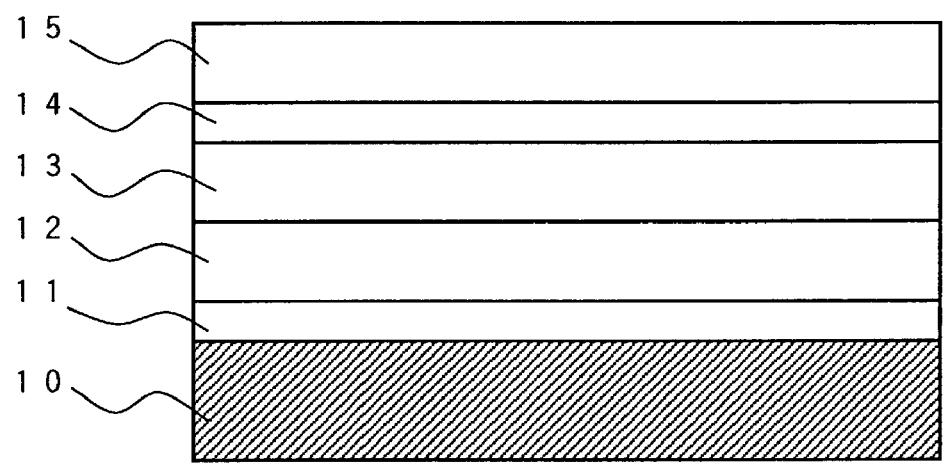
FIG. 3 is a schematic cross-sectional view of the nitride-based semiconductor light-emitting device during fabrication in the first embodiment, after an n-type clad layer is exposed.

Next, the side face of the wafer and the surface of translucent base 10 are covered with electron wax, and Si substrate 18 is removed by an etchant obtained by mixing 70% hydrofluoric acid, 60% nitric acid and glacial acetic acid in a ratio of 5:2:2, to expose the surface of buffer layer 19 composed of AlN. Thereafter, the electron wax is removed with an organic solvent such as acetone. Buffer layer 19 composed of AlN is then removed by dry etching, to expose the surface of n-type clad layer 15. FIG. 3 shows a state of the wafer at this stage. Even if Si substrate 18 is completely removed in such a manner, translucent base 10 composed of the translucent resin serves as the support base. Therefore, this wafer can be handled as a normal light-emitting device wafer.

Figure 4:
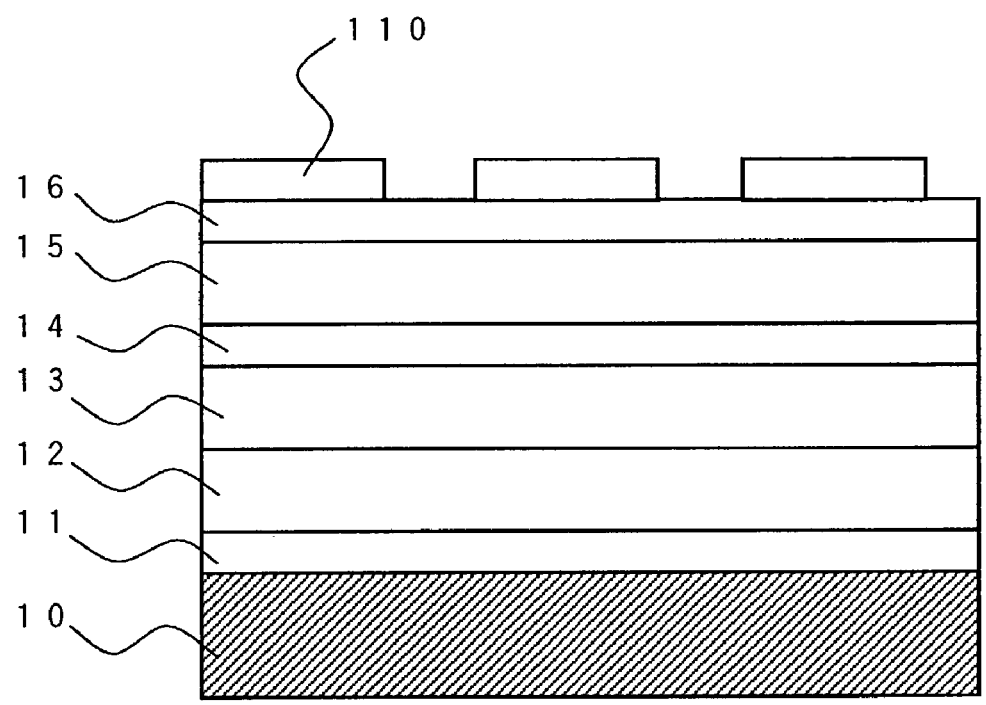
FIG. 4 is a schematic cross-sectional view of the nitride-based semiconductor light-emitting device during fabrication in the first embodiment, after a photoresist is formed.
Figure 5:
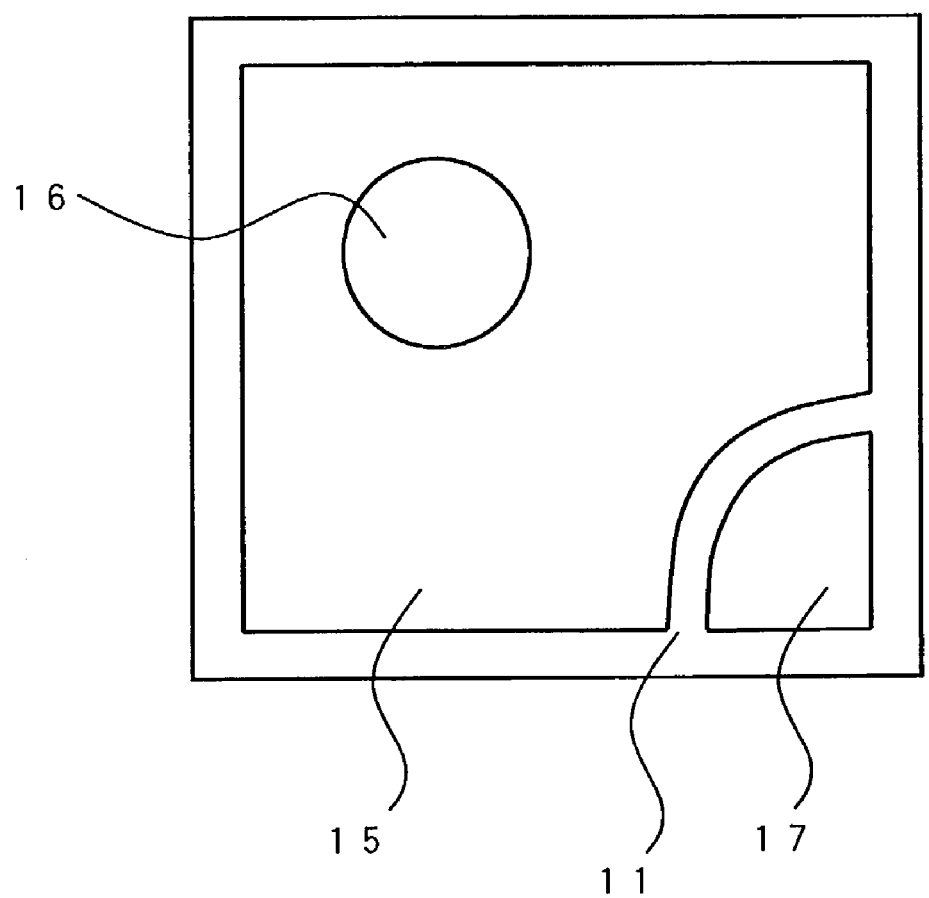
FIG. 5 is a schematic enlarged top view of the nitride-based semiconductor light-emitting device in the first embodiment.

Next, as shown in FIG. 4, Hf and Al are evaporated to a thickness of 5 nm and 200 nm respectively on the exposed surface of n-type clad layer 15, to form n-type electrode layer 16. During evaporation, heating temperature is set approximately to 80° C. so as to obtain good ohmic contact. Then, after a photoresist 110 is formed as a mask for dry etching, the surface of p-type electrode layer 11 is exposed by etching. On exposed p-type electrode layer 11, p-type pad electrode 17 composed of Pd and Au is formed by evaporation. Photoresist 110 is removed, and this wafer is divided by dicing into portions 300 μm square. FIG. 5 is a schematic enlarged top view of the nitride-based semiconductor light-emitting device in the present embodiment, fabricated in a manner described above.

Figure 6A:
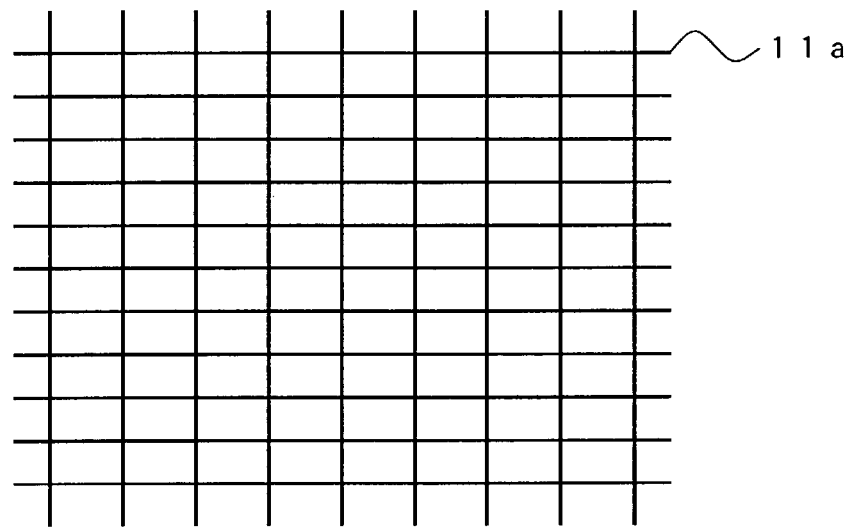
FIGS. 6A and 6B are schematic top views showing one example of a meshed p-type electrode layer used in the nitride-based semiconductor light-emitting device of the present invention.
Figure 6B:
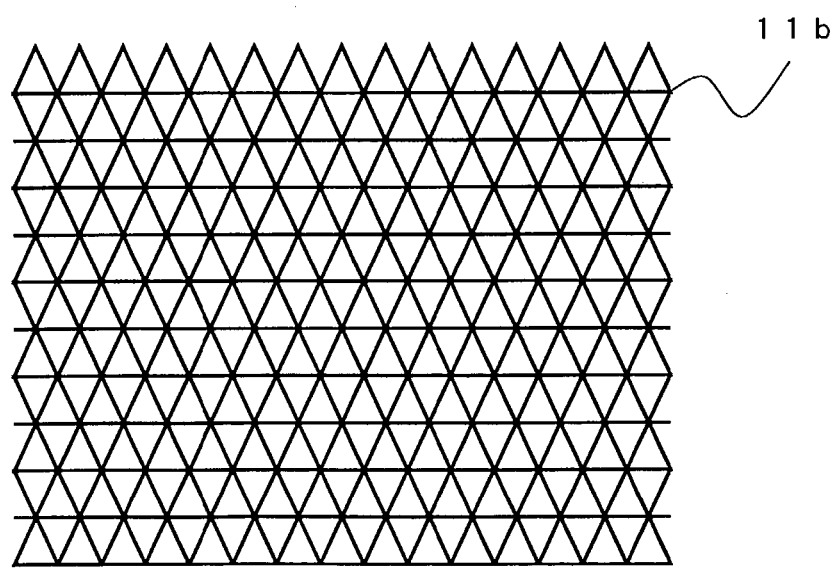

When the nitride-based semiconductor light-emitting device in the present embodiment fabricated in such a manner is subjected to die-bonding to a lead frame or the like with the Ag paste or the like with good reflectivity, light emitted from light-emitting layer 14 to the side of translucent base 10 enters translucent base 10 with little absorption, and is reflected by a bottom face of translucent base 10. Accordingly, the light can be extracted from a side face of translucent base 10 to the outside of the device. Thus, the nitride-based semiconductor light-emitting device capable of improving extraction efficiency of the light emitted from light-emitting layer 14 can be fabricated. It is to be noted that p-type electrode layer 11 may be formed in a meshed manner as shown in FIGS. 6A and 6B, for example.

(Second Embodiment)

Figure 7:
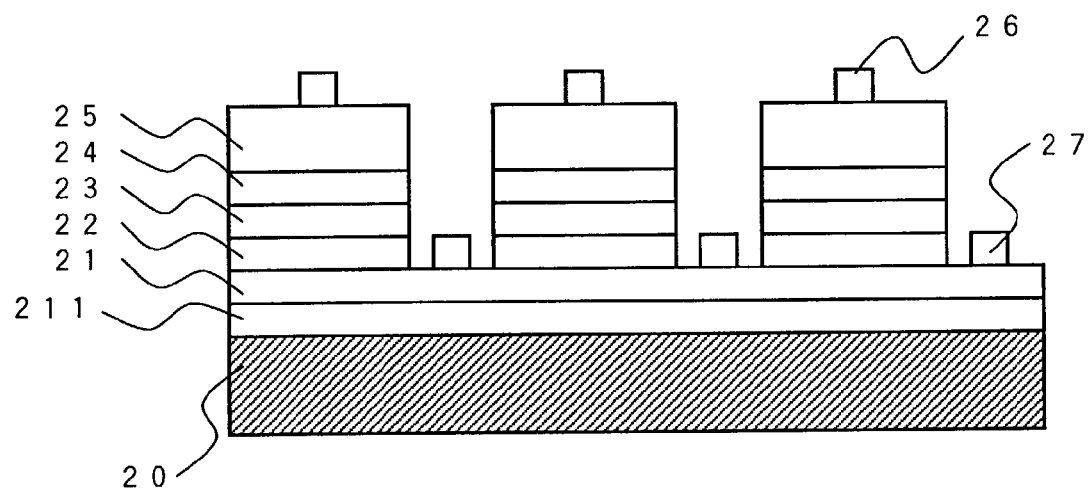
FIG. 7 is a schematic side view of a nitride-based semiconductor light-emitting device in a second embodiment.

FIG. 7 shows a schematic side view of one embodiment of the nitride-based semiconductor light-emitting device according to the present invention, using the transparent conductive layer. In FIG. 7, in the nitride-based semiconductor light-emitting device according to the present invention, a transparent conductive layer 211 composed of ITO, a p-type electrode layer 21 composed of Pd, a p-type contact layer 22 composed of p-type GaN, a p-type clad layer 23 composed of p-type AlGaN, a light-emitting layer 24 consisting of a barrier layer composed of GaN and a well layer composed of InGaN, an n-type clad layer 25 composed of Si doped GaN, and an n-type electrode layer 26 composed of Hf and Al are successively layered on a translucent base 20 composed of the translucent resin. On p-type electrode layer 21, a p-type pad electrode 27 composed of Pd and Au is formed.

Figure 8:
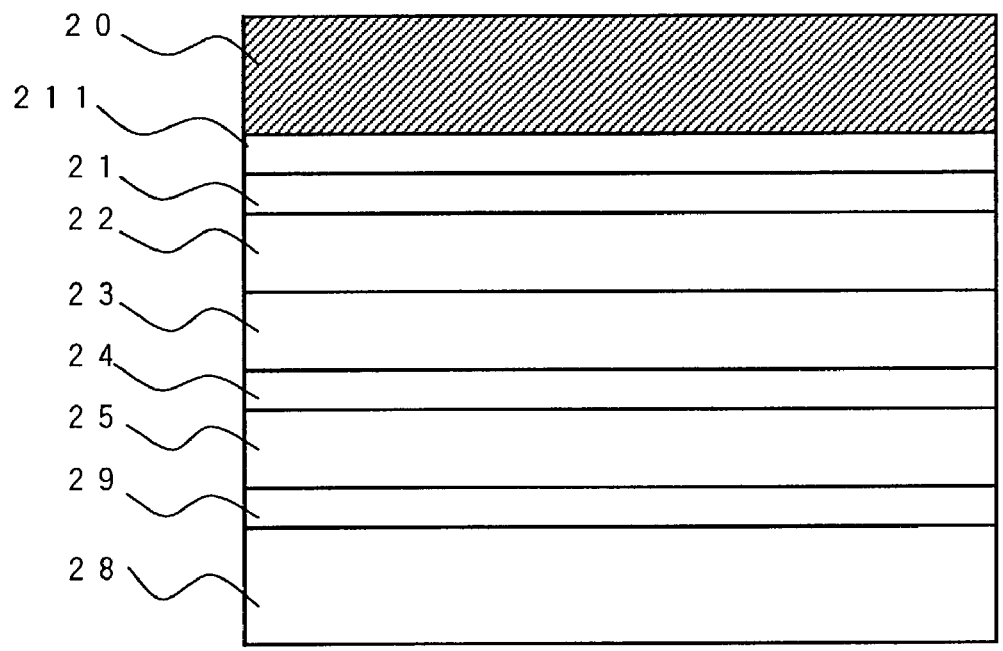
FIG. 8 is a schematic cross-sectional view of the nitride-based semiconductor light-emitting device during fabrication in the second embodiment, after a translucent base is formed.

In the following, a manufacturing method of the nitride-based semiconductor light-emitting device in the present embodiment will be described. Initially, as shown in FIG. 8, a buffer layer 29 composed of AlN, n-type clad layer 25, light-emitting layer 24, p-type clad layer 23 and p-type contact layer 22 are successively formed on an Si substrate 28. Then, Pd is evaporated to a thickness of 10 nm as p-type electrode layer 21 on the surface of p-type contact layer 22, followed by heat treatment for three minutes at 500° C. in vacuum. Thus, p-type electrode layer 21 is alloyed with p-type contact layer 22. By alloying, adhesion between p-type electrode layer 21 and p-type contact layer 22 is improved. Next, ITO of a film thickness of 100 nm is formed by sputtering as transparent conductive layer 211 on p-type electrode layer 21. The thermosetting resin is applied as translucent base 20 onto transparent conductive layer 211, and heated at 130° C. for 90 minutes for curing. FIG. 8 shows a state of a wafer at this stage.

Figure 9:
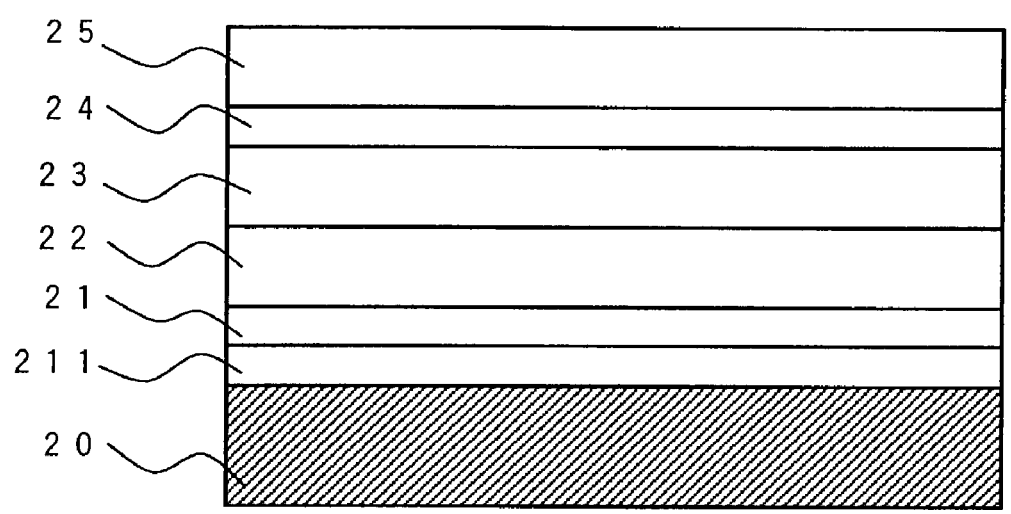
FIG. 9 is a schematic cross-sectional view of the nitride-based semiconductor light-emitting device during fabrication in the second embodiment, after an n-type clad layer is exposed.

Next, the side face of the wafer and the surface of translucent base 20 are covered with electron wax, and Si substrate 28 is removed by an etchant obtained by mixing 70% hydrofluoric acid, 60% nitric acid and glacial acetic acid in a ratio of 5:2:2, to expose the surface of buffer layer 29 composed of AlN. Thereafter, the electron wax is removed with an organic solvent such as acetone. Buffer layer 29 composed of AlN is then removed by dry etching, to expose the surface of n-type clad layer 25. FIG. 9 shows a state of the wafer at this stage. Even if Si substrate 28 is completely removed in such a manner, translucent base 20 composed of the translucent resin serves as the support base. Therefore, this wafer can be handled as a normal light-emitting device wafer.

Figure 10:
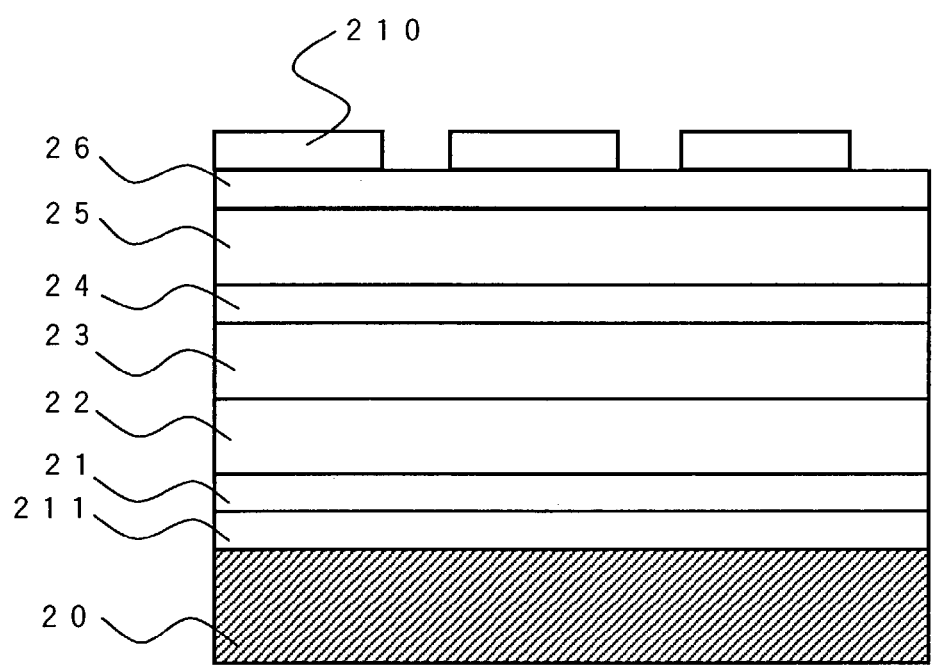
FIG. 10 is a schematic cross-sectional view of the nitride-based semiconductor light-emitting device during fabrication in the second embodiment, after a photoresist is formed.
Figure 11:
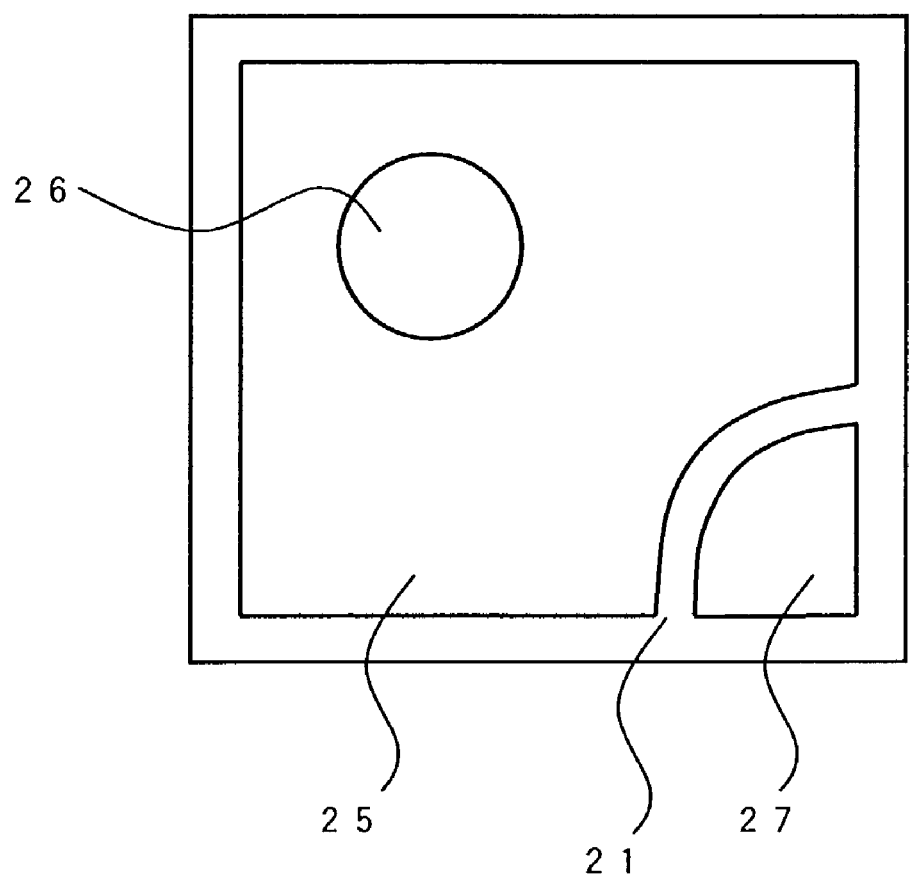
FIG. 11 is a schematic enlarged top view of the nitride-based semiconductor light-emitting device in the second embodiment.

Next, as shown in FIG. 10, Hf and Al are evaporated to a thickness of 5 nm and 200 nm respectively on the exposed surface of n-type clad layer 25, to form n-type electrode layer 26. During evaporation, heating temperature is set approximately to 80° C. so as to obtain good ohmic contact. Then, after a photoresist 210 is formed as a mask for dry etching, the surface of p-type electrode layer 21 is exposed by etching. On exposed p-type electrode layer 21, p-type pad electrode 27 composed of Pd and Au is formed by evaporation. Photoresist 210 is removed, and this wafer is divided by dicing into portions 300 μm square. FIG. 11 shows a schematic enlarged top view of the nitride-based semiconductor light-emitting device in the present embodiment, fabricated in a manner described above.

When the nitride-based semiconductor light-emitting device in the present embodiment fabricated in such a manner is subjected to die-bonding to a lead frame or the like with the Ag paste or the like with good reflectivity, light emitted from light-emitting layer 24 to the side of translucent base 20 enters translucent base 20 with little absorption, and is reflected by a bottom face of translucent base 20. Accordingly, the light can be extracted from a side face of translucent base 20 to the outside of the device. Thus, the nitride-based semiconductor light-emitting device capable of improving extraction efficiency of the light emitted from light-emitting layer 24 can be fabricated.

(Third Embodiment)

Figure 12:
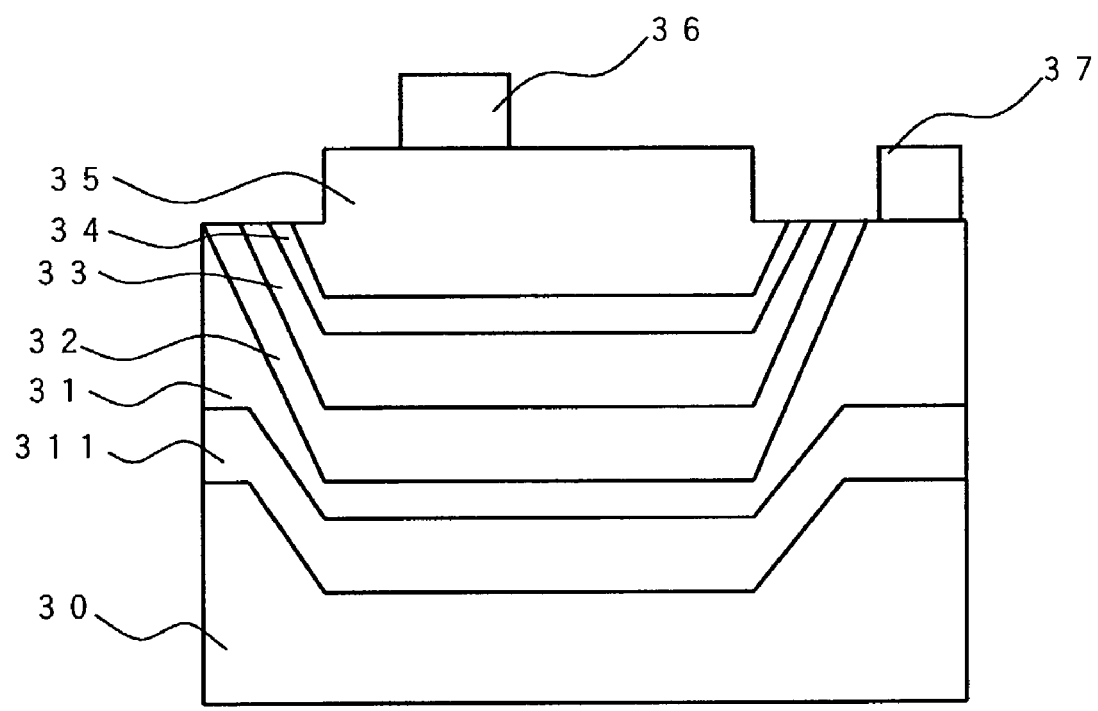
FIG. 12 is a schematic cross-sectional view of a nitride-based semiconductor light-emitting device in a third embodiment.

FIG. 12 shows a schematic cross-sectional view of one embodiment of the nitride-based semiconductor light-emitting device according to the present invention, in which the nitride-based semiconductor layer on the substrate is selectively grown. In FIG. 12, in the nitride-based semiconductor light-emitting device according to the present invention, a transparent conductive layer 311 composed of ITO, a p-type electrode layer 31 composed of Pd, a p-type contact layer 32 composed of p-type GaN, a p-type clad layer 33 composed of p-type AlGaN, a light-emitting layer 34 consisting of a barrier layer composed of GaN and a well layer composed of InGaN, an n-type clad layer 35 composed of Si doped GaN, and an n-type electrode layer 36 composed of Hf and Al are successively layered on a translucent base 30 composed of the translucent resin. On p-type electrode layer 31, a p-type pad electrode 37 composed of Pd and Au is formed.

Figure 13:
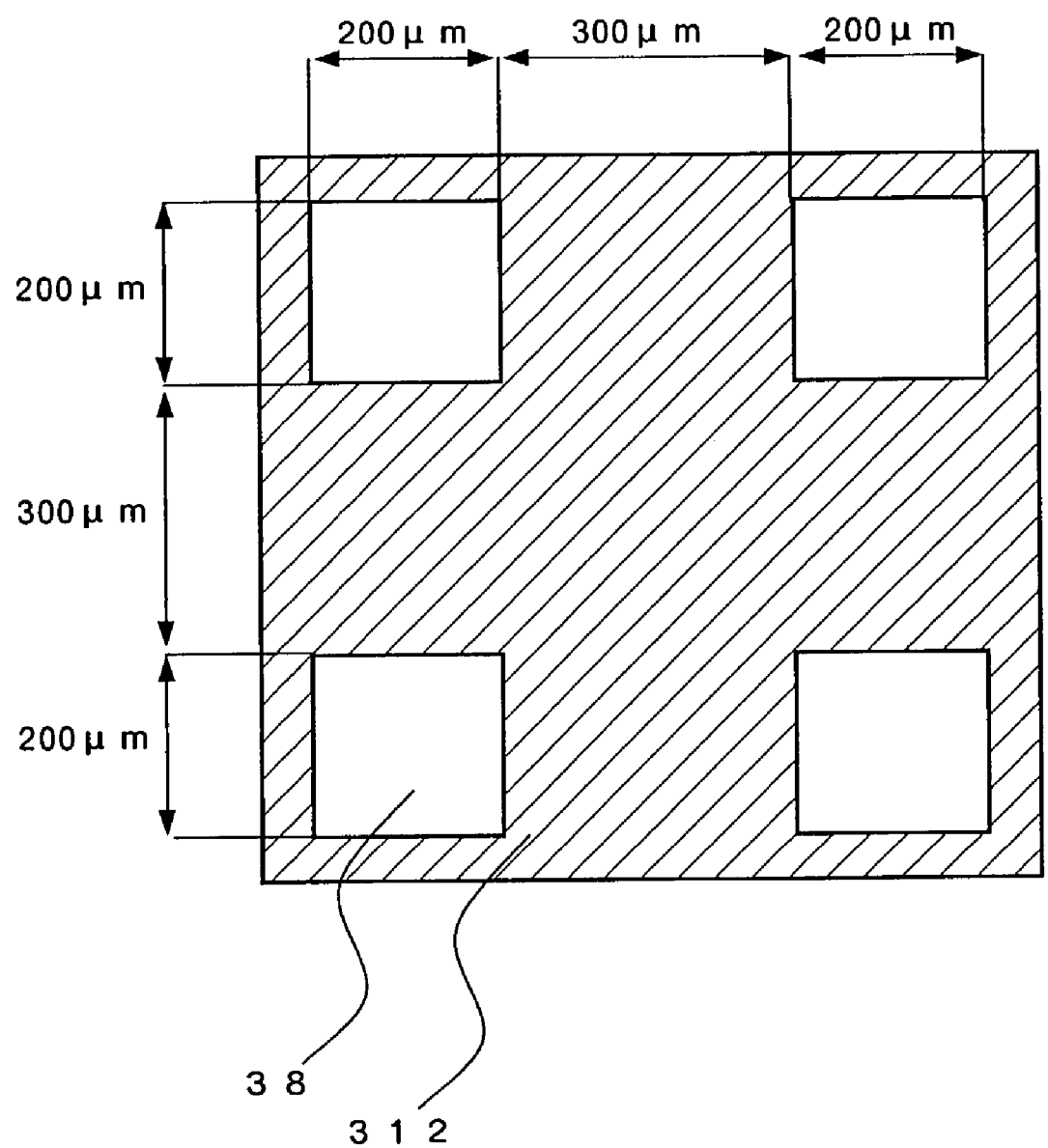
FIG. 13 is a schematic top view of the nitride-based semiconductor light-emitting device during fabrication in the third embodiment, after an $SiO_2$ mask is formed.

In the following, a manufacturing method of the nitride-based semiconductor light-emitting device of the present embodiment will be described. First, as shown in FIG. 13, an SiO$_2$ mask 312 is formed to a film thickness of 300 nm on an Si substrate 38. Here, an exposed portion of Si substrate 38 is in a shape 200 μm square, and the exposed, square-shaped Si substrate 38 portion is spaced apart from each other by a distance of 300 μm.

Figure 14:
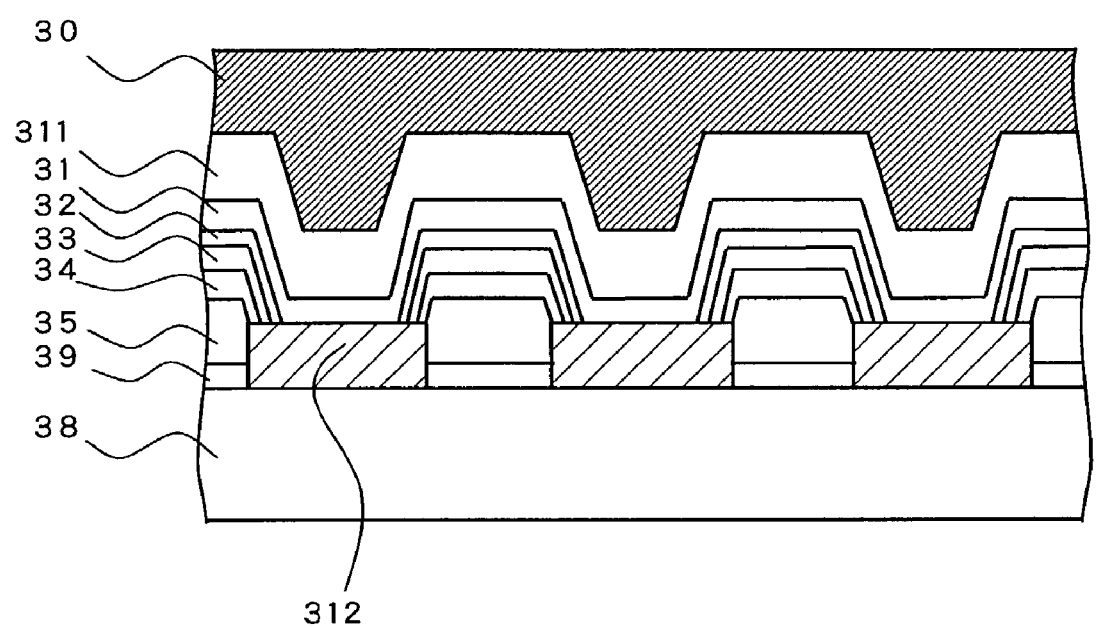
FIG. 14 is a schematic cross-sectional view of the nitride-based semiconductor light-emitting device during fabrication in the third embodiment, after a translucent base is formed.

Next, as shown in FIG. 14, a buffer layer 39 composed of AlN, n-type clad layer 35, light-emitting layer 34, p-type clad layer 33 and p-type contact layer 32 are selectively and successively formed on exposed Si substrate 38. Then, Pd is evaporated to a thickness of 50 nm as p-type electrode layer 31 on the surface of p-type contact layer 32, followed by heat treatment for three minutes at 500° C. in vacuum. Thus, p-type electrode layer 31 is alloyed with p-type contact layer 32. By alloying, adhesion between p-type electrode layer 31 and p-type contact layer 32 is improved. Next, ITO of a film thickness of 100 nm is formed by sputtering as transparent conductive layer 311 on p-type electrode layer 31. The thermosetting resin is applied as translucent base 30 onto transparent conductive layer 311, and heated at 130° C. for 90 minutes for curing. FIG. 14 shows a state of a wafer at this stage.

Next, the side face of the wafer and the surface of translucent base 30 are covered with electron wax, and Si substrate 38 is removed by an etchant obtained by mixing 70% hydrofluoric acid, 60% nitric acid and glacial acetic acid in a ratio of 5:2:2, to expose the surface of buffer layer 39 composed of AlN. Here, SiO$_2$ mask 312 is also removed by the etchant, to expose p-type electrode layer 31. Thereafter, the electron wax is removed with an organic solvent such as acetone. Thus, even if Si substrate 38 is completely removed in such a manner, translucent base 30 composed of the translucent resin serves as the support base. Therefore, this wafer can be handled as a normal light-emitting device wafer. Buffer layer 39 composed of AlN is then removed by dry etching, to expose the surface of n-type clad layer 35.

Figure 15:
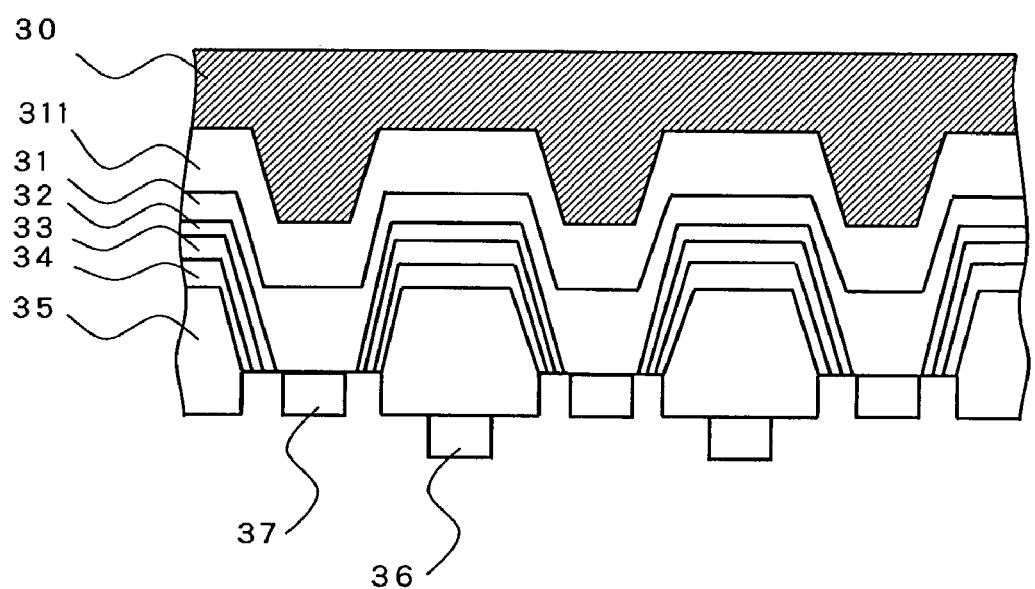
FIG. 15 is a schematic cross-sectional view of the nitride-based semiconductor light-emitting device during fabrication in the third embodiment, after a p-type pad electrode is formed by evaporation.
Figure 16:
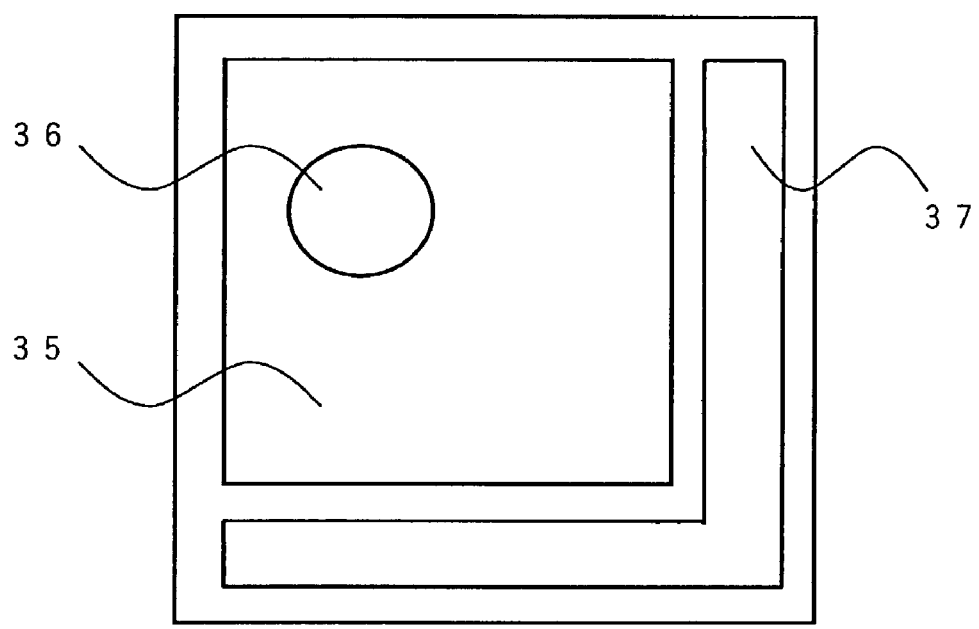
FIG. 16 is a schematic top view of the nitride-based semiconductor light-emitting device in the third embodiment.

Next, as shown in FIG. 15, Hf and Al are evaporated to a thickness of 5 nm and 200 nm respectively on the exposed surface of n-type clad layer 35, to form n-type electrode layer 36. During evaporation, heating temperature is set approximately to 80° C. so as to obtain good ohmic contact. On exposed p-type electrode layer 31, p-type pad electrode 37 composed of Pd and Au is formed by evaporation. FIG. 15 shows a state of the wafer at this stage. Finally, this wafer is divided by dicing into portions 300 μm square. FIG. 16 shows a schematic top view of the nitride-based semiconductor light-emitting device in the present embodiment, fabricated in a manner described above.

When the nitride-based semiconductor light-emitting device in the present embodiment fabricated in such a manner is subjected to die-bonding to a lead frame or the like with the Ag paste or the like with good reflectivity, light emitted from light-emitting layer 34 to the side of translucent base 30 enters translucent base 30 with little absorption, and is reflected by a bottom face of translucent base 30. Accordingly, the light can be extracted from a side face of translucent base 30 to the outside of the device. Thus, the nitride-based semiconductor light-emitting device capable of improving extraction efficiency of the light emitted from light-emitting layer 34 can be fabricated.

(Fourth Embodiment)

Figure 17:
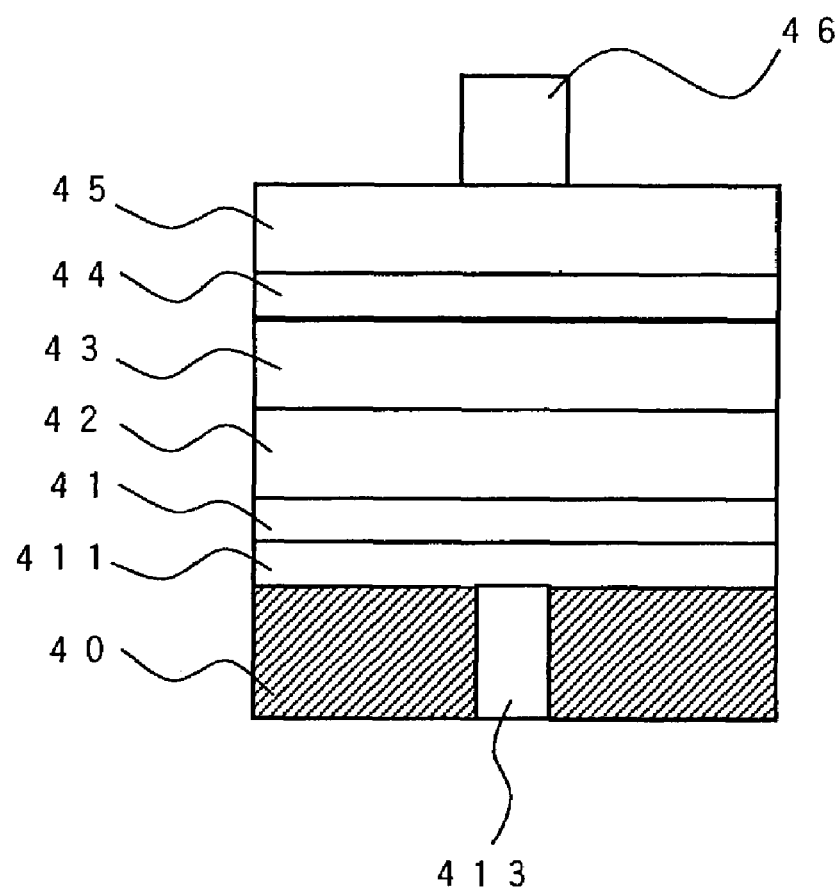
FIG. 17 is a schematic cross-sectional view of a nitride-based semiconductor light-emitting device in a fourth embodiment.

FIG. 17 shows a schematic cross-sectional view of one embodiment of the nitride-based semiconductor light-emitting device according to the present invention, provided with an Al bump on the transparent conductive layer. In FIG. 17, in the nitride-based semiconductor light-emitting device according to the present invention, a transparent conductive layer 411 composed of ITO, a p-type electrode layer 41 composed of Pd, a p-type contact layer 42 composed of p-type GaN, a p-type clad layer 43 composed of p-type AlGaN, a light-emitting layer 44 consisting of a barrier layer composed of GaN and a well layer composed of InGaN, an n-type clad layer 45 composed of Si doped GaN, and an n-type electrode layer 46 composed of Hf and Al are successively layered on a translucent base 40 composed of the translucent resin. In addition, an Al bump 413 is embedded in translucent base 40.

Figure 18:
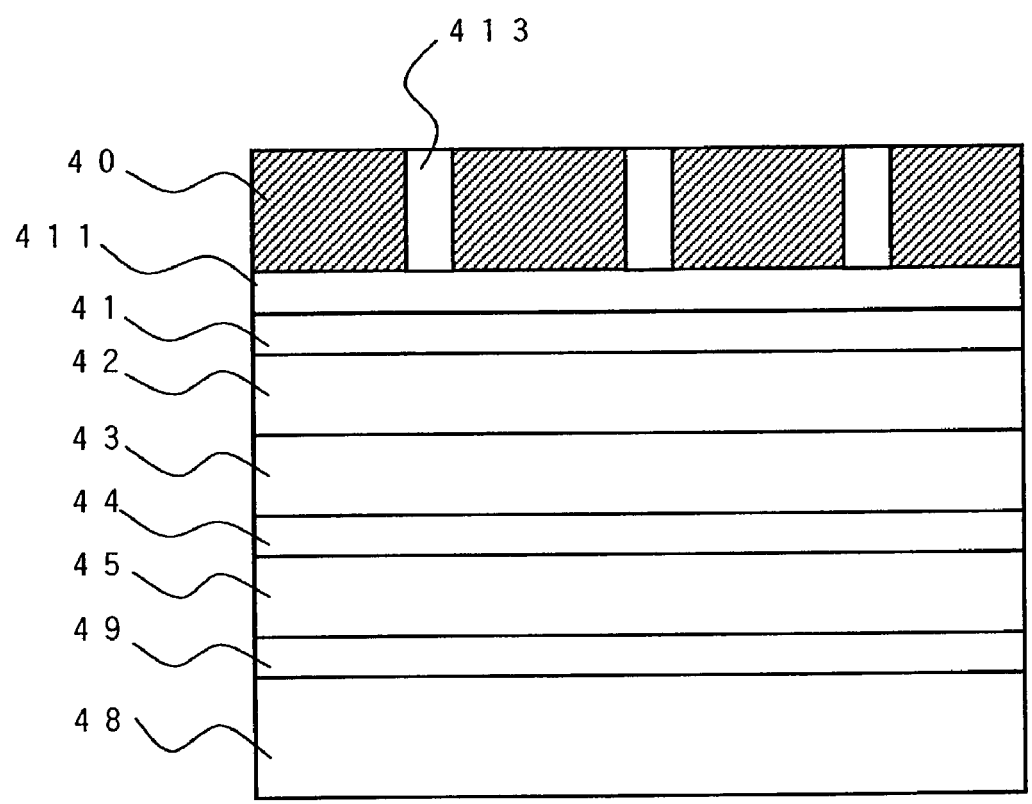
FIG. 18 is a schematic cross-sectional view of the nitride-based semiconductor light-emitting device during fabrication in the fourth embodiment, after an Al bump is formed.

In the following, a manufacturing method of the nitride-based semiconductor light-emitting device of the present embodiment will be described. First, as shown in FIG. 18, a buffer layer 49 composed of AlN, n-type clad layer 45, light-emitting layer 44, p-type clad layer 43 and p-type contact layer 42 are selectively and successively formed on an exposed Si substrate 48. Pd is then evaporated to a thickness of 10 nm as p-type electrode layer 41 on the surface of p-type contact layer 42, followed by heat treatment for three minutes at 500° C. in vacuum. Thus, p-type electrode layer 41 is alloyed with p-type contact layer 42. By alloying, adhesion between p-type electrode layer 41 and p-type contact layer 42 is improved. Next, ITO of a film thickness of 100 nm is formed by sputtering as transparent conductive layer 411 on p-type electrode layer 41.

Al bump 413 having a diameter of 70 μm and a height of 100 μm is formed on transparent conductive layer 411. Thereafter, the thermosetting epoxy resin serving as translucent base 40 is applied on transparent conductive layer 411, for embedding Al bump 413, followed by heating at 130° C. for 90 minutes for curing. Translucent base 40 is then polished, to expose the surface of Al bump 413 on translucent base 40. FIG. 18 shows a state of a wafer at this stage.

Next, the side face of the wafer and the surface of translucent base 40 are covered with electron wax, and Si substrate 48 is removed by an etchant obtained by mixing 70% hydrofluoric acid, 60% nitric acid and glacial acetic acid in a ratio of 5:2:2, to expose the surface of buffer layer 49 composed of AlN. Thereafter, the electron wax is removed with an organic solvent such as acetone. Thus, even if Si substrate 48 is completely removed in such a manner, translucent base 40 composed of the translucent resin serves as the support base. Therefore, this wafer can be handled as a normal light-emitting device wafer. Buffer layer 49 composed of AlN is then removed by dry etching, to expose the surface of n-type clad layer 45.

Figure 19:
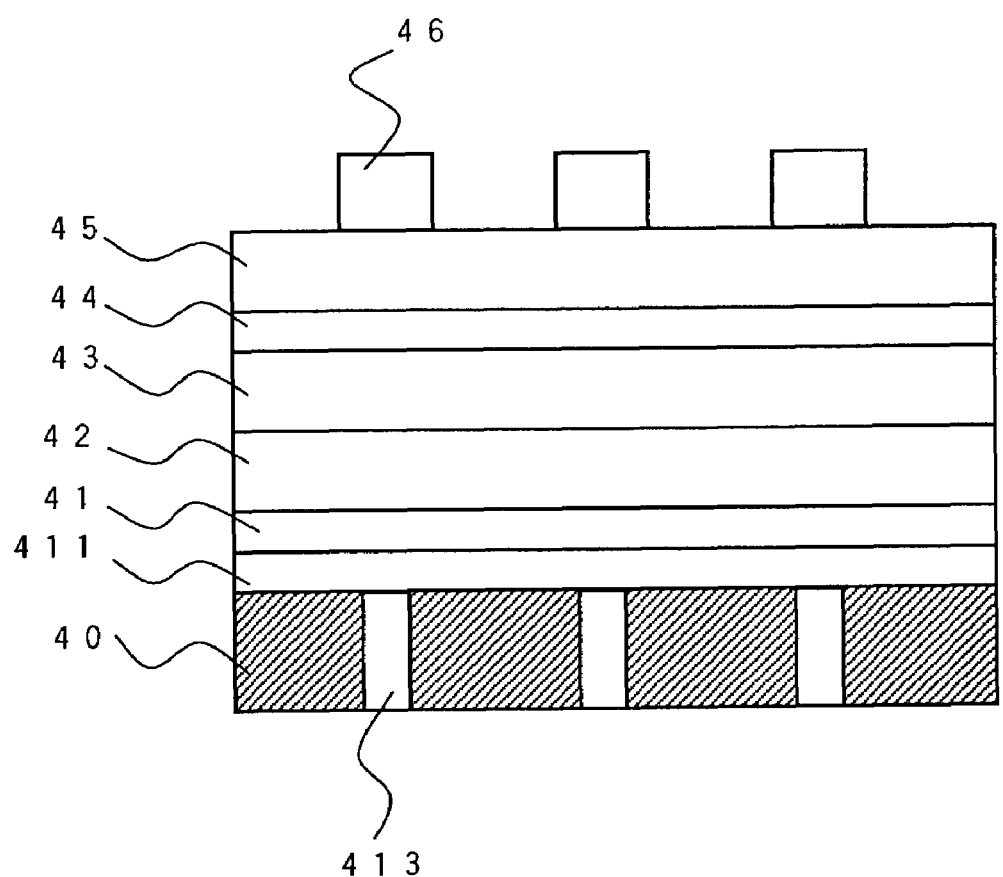
FIG. 19 is a schematic cross-sectional view of the nitride-based semiconductor light-emitting device during fabrication in the fourth embodiment, after an n-type electrode layer is formed.

Next, as shown in FIG. 19, Hf and Al are evaporated to a thickness of 5 nm and 200 nm respectively on the exposed surface of n-type clad layer 45, to form n-type electrode layer 46. FIG. 19 shows a state at this stage. During evaporation, heating temperature is set approximately to 80° C. so as to obtain good ohmic contact. Finally, this wafer is divided by dicing into portions 300 μm square.

When the nitride-based semiconductor light-emitting device in the present embodiment fabricated in such a manner is subjected to die-bonding to a lead frame or the like with the Ag paste or the like with good reflectivity, light emitted from light-emitting layer 44 to the side of translucent base 40 enters translucent base 40 with little absorption, and is reflected by a bottom face of translucent base 40. Accordingly, the light can be extracted from a side face of translucent base 40 to the outside of the device. Thus, the nitride-based semiconductor light-emitting device capable of improving extraction efficiency of the light emitted from light-emitting layer 44 can be fabricated.

(Fifth Embodiment)

Figure 20:
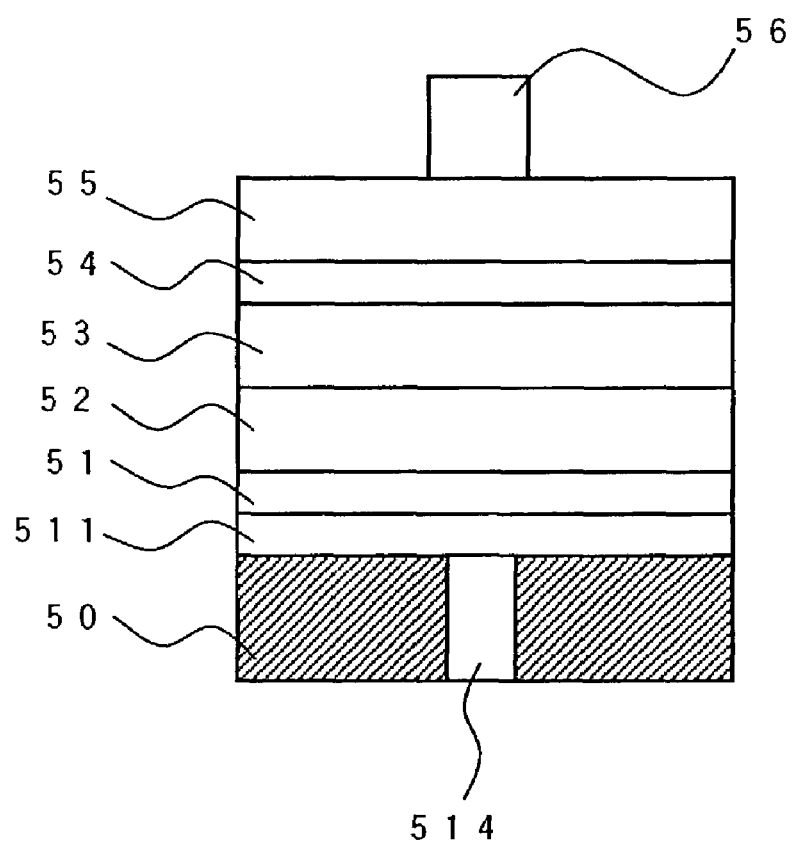
FIG. 20 is a schematic cross-sectional view of a nitride-based semiconductor light-emitting device in a fifth embodiment.

FIG. 20 shows a schematic cross-sectional view of another embodiment of the nitride-based semiconductor light-emitting device according to the present invention, provided with an Ni-plated layer on the transparent conductive layer. In FIG. 20, in the nitride-based semiconductor light-emitting device according to the present invention, a transparent conductive layer 511 composed of ITO, a p-type electrode layer 51 composed of Pd, a p-type contact layer 52 composed of p-type GaN, a p-type clad layer 53 composed of p-type AlGaN, a light-emitting layer 54 consisting of a barrier layer composed of GaN and a well layer composed of InGaN, an n-type clad layer 55 composed of Si doped GaN, and an n-type electrode layer 56 composed of Hf and Al are successively layered on a translucent base 50 composed of the translucent resin. In addition, a thick-film Ni-plated layer 514 is embedded in translucent base 50.

Figure 21:
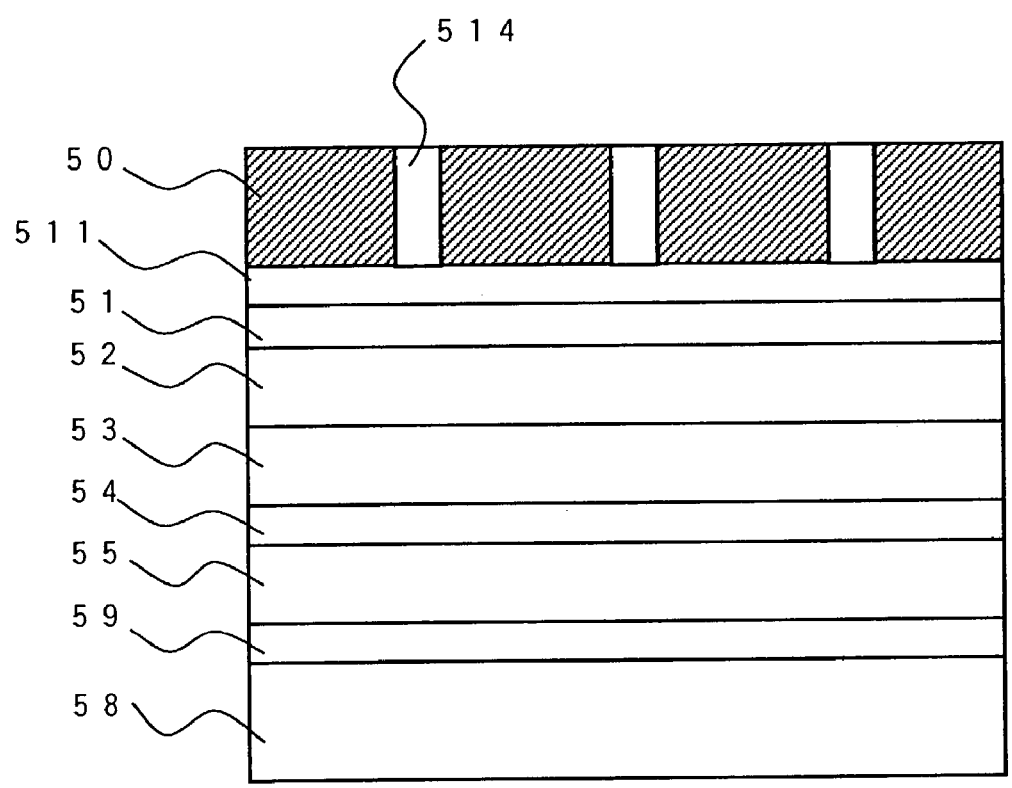
FIG. 21 is a schematic cross-sectional view of the nitride-based semiconductor light-emitting device during fabrication in the fifth embodiment, after an Ni-plated layer is formed.

In the following, a manufacturing method of the nitride-based semiconductor light-emitting device of the present embodiment will be described. First, as shown in FIG. 21, a buffer layer 59 composed of AlN, n-type clad layer 55, light-emitting layer 54, p-type clad layer 53 and p-type contact layer 52 are selectively and successively formed on an Si substrate 58. Then, Pd is evaporated to a thickness of 10 nm as p-type electrode layer 51 on the surface of p-type contact layer 52, followed by heat treatment for three minutes at 500° C. in vacuum. Thus, p-type electrode layer 51 is alloyed with p-type contact layer 52. By alloying, adhesion between p-type electrode layer 51 and p-type contact layer 52 is improved. Next, ITO of a film thickness of 100 nm is formed by sputtering as transparent conductive layer 511 on p-type electrode layer 51.

Next, a translucent resist for thick-film plating having an opening of 100 μm in diameter is formed to a thickness of 100 μm as translucent base 50. Then, with electroless plating, thick-film Ni-plated layer 514 is formed to a thickness of 100 μm in the opening. FIG. 21 shows a state at this stage.

Then, the side face of the wafer and the surface of translucent base 50 are covered with electron wax, and Si substrate 58 is removed by an etchant obtained by mixing 70% hydrofluoric acid, 60% nitric acid and glacial acetic acid in a ratio of 5:2:2, to expose the surface of buffer layer 59 composed of AlN. Thereafter, the electron wax is removed with an organic solvent such as acetone. Thus, even if Si substrate 58 is completely removed in such a manner, translucent base 50 composed of the translucent resin serves as the support base. Therefore, this wafer can be handled as a normal light-emitting device wafer. Buffer layer 59 composed of AlN is then removed by dry etching, to expose the surface of n-type clad layer 55.

Figure 22:
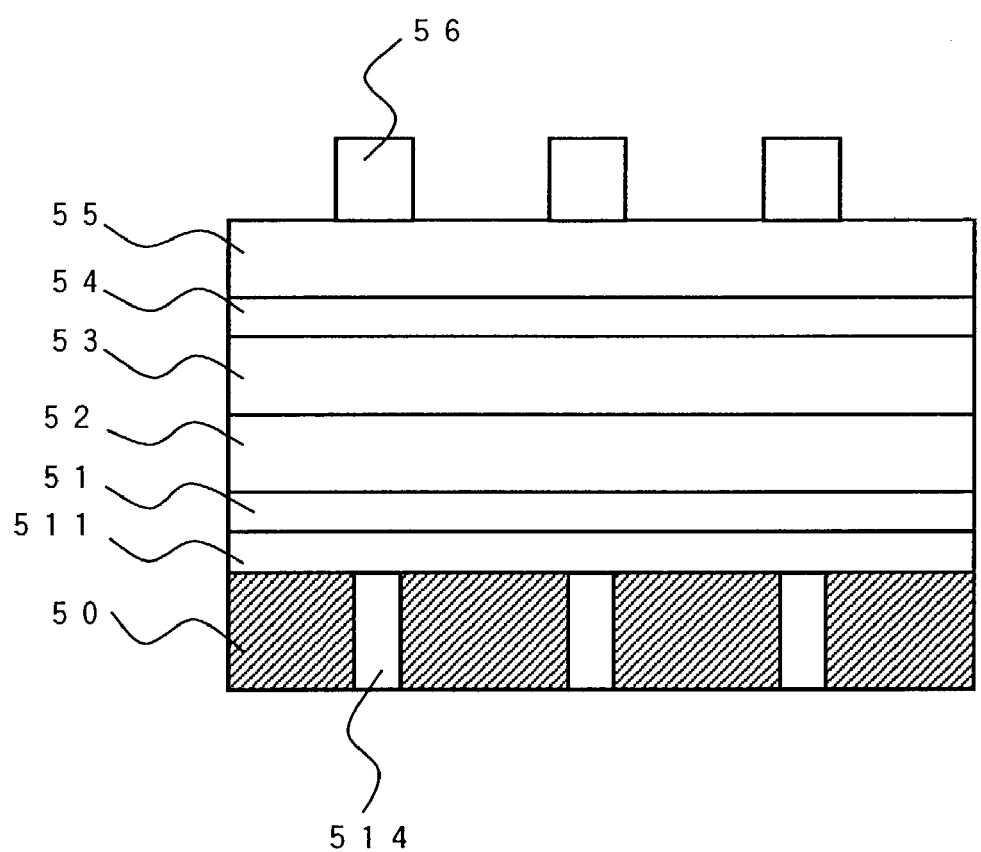
FIG. 22 is a schematic cross-sectional view of the nitride-based semiconductor light-emitting device during fabrication in the fifth embodiment, after an n-type electrode layer is formed.
Figure 23:
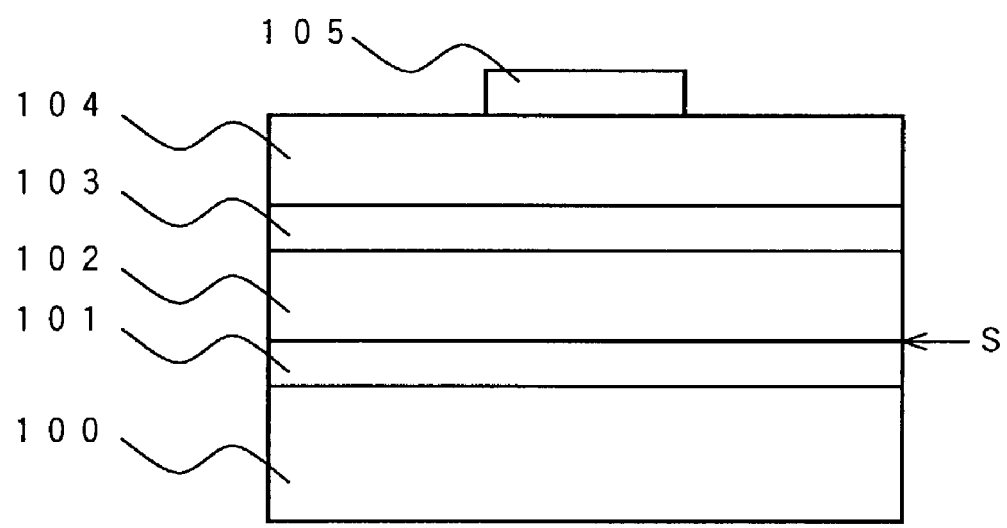
FIG. 23 is a schematic cross-sectional view of a conventional nitride-based semiconductor light-emitting device.

Next, as shown in FIG. 22, Hf and Al are evaporated to a thickness of 5 nm and 200 nm respectively on the exposed surface of n-type clad layer 55, to form n-type electrode layer 56. FIG. 22 shows a state at this stage. During evaporation, heating temperature is set approximately to 80° C. so as to obtain good ohmic contact. Finally, this wafer is divided by dicing into portions 300 μm square.

When the nitride-based semiconductor light-emitting device in the present embodiment fabricated in such a manner is subjected to die-bonding to a lead frame or the like with the Ag paste or the like with good reflectivity, light emitted from light-emitting layer 54 to the side of translucent base 50 enters translucent base 50 with little absorption, and is reflected by a bottom face of translucent base 50. Accordingly, the light can be extracted from a side face of translucent base 50 to the outside of the device. Thus, the nitride-based semiconductor light-emitting device capable of improving extraction efficiency of light emitted from light-emitting layer 54 can be fabricated.

The nitride-based semiconductor light-emitting device fabricated in each embodiment described above has light extraction efficiency 2 to 2.5 times higher than that of the conventional nitride-based semiconductor light-emitting device.

As described above, according to the present invention, extraction efficiency of light emitted from the light-emitting layer can be improved. In addition, when the translucent base contains the wavelength-changing material, a light-emitting device emitting light of which color ranges in red, blue, green, or combination thereof, or white can be fabricated. Moreover, if the translucent resin or SOG is used for the translucent base, a light-emitting device can be fabricated with low cost.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A nitride-based semiconductor light-emitting device, comprising:
    a translucent base;
    a first conductivity type nitride-based semiconductor layer;
    a light-emitting layer; and
    a second conductivity type nitride-based semiconductor layer that are successively layered above a reflective base, the translucent base being configured so that light from the light-emitting layer is extracted from at least one side face of the translucent base after being reflected at the interface between the translucent base and the reflective base, and an upper surface of the translucent base being parallel with a lower surface of the translucent base, wherein at least a portion of a first conductivity type electrode layer is formed between said translucent base and said first conductivity type nitride-based semiconductor so that the first conductivity type electrode layer contacts the translucent base and is electrically connected to said first conductivity type nitride-based semiconductor layer, wherein said first conductivity type electrode layer includes at least one of a metal thin-film layer and a transparent conductive layer, and a second conductivity type electrode layer is electrically connected to said second conductivity type nitride-based semiconductor layer, wherein said translucent base comprises a translucent resin or SOG.

2. The nitride-based semiconductor light-emitting device according to claim 1, wherein said translucent base includes a wavelength-changing material.

3. The nitride-based semiconductor light-emitting device according to claim 1, wherein said first conductivity type nitride-based semiconductor layer is a p-type nitride-based semiconductor layer, and said second conductivity type nitride-based semiconductor layer is an n-type nitride-based semiconductor layer.

4. The nitride-based semiconductor light-emitting device according to claim 1, wherein said first conductivity type electrode layer formed between the translucent base and the first conductivity type nitride-based semiconductor layer is formed so as to be in contact with almost the entire surface of said first conductivity type nitride-based semiconductor layer.

5. The nitride-based semiconductor light-emitting device according to claim 1, wherein at least a portion of said first conductivity type electrode layer formed between the translucent base and the first conductivity type nitride-based semiconductor layer is formed in a meshed manner.

6. The nitride-based semiconductor light-emitting device according to claim 1, wherein said first conductivity type electrode layer includes a conductor forming ohmic contact with said first conductivity type nitride-based semiconductor layer.

7. The nitride-based semiconductor light-emitting device according to claim 1, wherein said metal thin-film layer contains at least one metal selected from a group consisting of palladium (Pd), nickel (Ni), platinum (Pt), rhodium (Rh), ruthenium (Ru), osmium (Os), iridium (Ir), hafnium (Hf), titanium (Ti), aluminum (Al), scandium (Sc), zirconium (Zr), and vanadium (V).

8. The nitride-based semiconductor light-emitting device according to claim 1, wherein said transparent conductive layer contains an oxide of at least one element selected from a group consisting of zinc (Zn), indium (In), tin (Sn), magnesium (Mg), cadmium (Cd), gallium (Ga), and lead (Pb).

9. The nitride-based semiconductor light-emitting device according to claim 1, wherein the translucent base is die-bonded to a lead frame with an Ag paste, and the reflective base comprises the lead frame and the Ag paste.

10. A nitride-based semiconductor light-emitting device, comprising:
a translucent base; a first conductivity type nitride-based semiconductor layer; a light-emitting layer; and a second conductivity type nitride-based semiconductor layer that are successively layered above a reflective base, the translucent base being configured so that light from the light-emitting layer is extracted from at least one side face of the translucent base after being reflected at the interface between the translucent base and the reflective base, and an upper surface of the translucent base being parallel with a lower surface of the translucent base, wherein a first conductivity type electrode layer is electrically connected to said first conductivity type nitride-based semiconductor layer, wherein said first conductivity type electrode layer includes at least one of a metal thin-film layer and a transparent conductive layer, and a second conductivity type electrode layer is electrically connected to said second conductivity type nitride-based semiconductor layer, wherein said first conductivity type nitride-based semiconductor layer is a p-type nitride-based semiconductor layer, and said second conductivity type nitride-based semiconductor layer is an n-type nitride-based semiconductor layer, and further wherein at least a portion of said first conductivity type electrode layer is formed between said translucent base and said first conductivity type nitride-based semiconductor layer so that the first conductivity type electrode layer contacts the translucent base.

11. The nitride-based semiconductor light-emitting device according to claim 10, wherein said translucent base includes a wavelength-changing material.

12. The nitride-based semiconductor light-emitting device according to claim 10, wherein said first conductivity type electrode layer formed between the translucent base and the first conductivity type nitride-based semiconductor layer is formed so as to be in contact with almost the entire surface of said first conductivity type nitride-based semiconductor layer.

13. The nitride-based semiconductor light-emitting device according to claim 10, wherein at least a portion of said first conductivity type electrode layer formed between the translucent base and the first conductivity type nitride-based semiconductor layer is formed in a meshed manner.

14. The nitride-based semiconductor light-emitting device according to claim 10, wherein said first conductivity type electrode layer includes a conductor forming ohmic contact with said first conductivity type nitride-based semiconductor layer.

15. The nitride-based semiconductor light-emitting device according to claim 10, wherein said metal thin-film layer contains at least one metal selected from a group consisting of palladium (Pd), nickel (Ni), platinum (Pt), rhodium (Rh), ruthenium (Ru), osmium (Os), iridium (Ir), hafnium (Hf), titanium (Ti), aluminum (Al), scandium (Sc), zirconium (Zr), and vanadium (V).

16. The nitride-based semiconductor light-emitting device according to claim 10, wherein said transparent conductive layer contains an oxide of at least one element selected from a group consisting of zinc (Zn), indium (In), tin (Sn), magnesium (Mg), cadmium (Cd), gallium (Ga), and lead (Pb).

17. The nitride-based semiconductor light-emitting device according to claim 1, further comprising a conductor embedded within the translucent resin base,
wherein at least a portion of said conductor is in contact with said first conductivity type electrode layer, and is configured to serve as an electrical connection on the outside of the nitride-based semiconductor light-emitting device.

18. The nitride-based semiconductor light-emitting device according to claim 10, further comprising a conductor embedded within the translucent base, wherein at least a portion of said conductor is in contact with said first conductivity type electrode layer, and is configured to serve as an electrical connection on the outside of the nitride-based semiconductor light-emitting device.

* * * * *